United States Patent
Warashina et al.

(10) Patent No.: US 8,548,284 B2
(45) Date of Patent: Oct. 1, 2013

(54) OPTICAL ELEMENT MODULE AND METHOD OF MANUFACTURING THE SAME

(75) Inventors: Yoshihisa Warashina, Hamamatsu (JP); Masayuki Ishida, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 486 days.

(21) Appl. No.: 12/630,974

(22) Filed: Dec. 4, 2009

(65) Prior Publication Data

US 2010/0142886 A1 Jun. 10, 2010

Related U.S. Application Data

(60) Provisional application No. 61/147,218, filed on Jan. 26, 2009.

(30) Foreign Application Priority Data

Dec. 5, 2008 (JP) ................ P2008-311248

(51) Int. Cl.
G02B 6/122 (2006.01)

(52) U.S. Cl.
USPC ......................................................... 385/14

(58) Field of Classification Search
USPC ......................................................... 385/14
See application file for complete search history.

(56) References Cited

U.S. PATENT DOCUMENTS

| 7,352,066 B2 * | 4/2008 | Budd et al. ............... 257/774 |
| 7,561,764 B2 * | 7/2009 | Bidnyk et al. ............... 385/14 |
| 2007/0085215 A1 | 4/2007 | Budd et al. |
| 2008/0226221 A1 | 9/2008 | Bidnyk et al. |

FOREIGN PATENT DOCUMENTS

| JP | 06-194502 | 7/1994 |
| JP | 06-204208 | 7/1994 |
| JP | 10-282370 A | 10/1998 |
| JP | 11-040823 | 2/1999 |
| JP | 2001-083373 A | 3/2001 |
| JP | 2004-212847 | 7/2004 |
| JP | 2005-010766 | 1/2005 |
| JP | 3709075 B2 | 10/2005 |

* cited by examiner

*Primary Examiner* — Sarah Hahm
(74) *Attorney, Agent, or Firm* — Drinker Biddle & Reath LLP

(57) ABSTRACT

A method of manufacturing an optical element module 1 in which an optical element 8 and a semiconductor circuit element 9 are mounted on one surface of a silicon substrate 2, a mirror surface 2a inclined at approximately 45 degrees is formed on the other surface, and an optical fiber 7 facing the mirror surface is disposed in a V groove formed along the other surface, the method of manufacturing includes the steps of forming the mirror surface 2a and V-shaped side surfaces of the V groove simultaneously by first crystal anisotropic etching on the other surface, and forming an attaching surface 2b substantially perpendicular to the one surface and the other surface, which is formed at an end side of the V groove, and for attaching an end of the optical fiber 7, by second crystal anisotropic etching in a crystal plane orientation different from that of the first crystal anisotropic etching. Thereby, it is possible to realize an optical element module including an optical element that receives light or emits light, a semiconductor circuit element, and an optical fiber optically connected to the optical element, the optical element module highly-functionally performs an optical connection between the optical element and the optical fiber, and realize a method of efficiently manufacturing the optical element module.

1 Claim, 20 Drawing Sheets

OPTICAL ELEMENT MODULE AND METHOD OF MANUFACTURING THE SAME

CROSS-REFERENCE TO RELATED APPLICATION

This application claims priority to Provisional Application Ser. No. 61/147,218 filed on Jan. 26, 2009, which is hereby incorporated by reference in its entirety.

BACKGROUND OF THE INVENTION

1. Field of the Invention

The present invention relates to an optical element module including an optical element that receives light or emits light, and a method of manufacturing the optical element module.

2. Related Background Art

In recent years, in order to transmit large volumes of information in communication systems and information processing systems, a technology of transmitting an optical signal generated from a light emitting element such as a laser oscillator element via an optical fiber serving as a light waveguide unit, and of receiving an optical signal transmitted via an optical fiber by a light receiving element such as a photodiode, has been indispensable. For that purpose, there has been technology development in order to optically connect a light receiving or emitting element and an optical fiber easily and inexpensively by use of downsized and large-capacity devices, in an optical communication module, an optical interconnection module, an optical measuring module, or the like.

Conventionally, in order to carry out precise positioning of a light receiving or emitting element and an optical fiber, there is adopted a so-called active alignment technique in which transmission and reception of optical signals are actually carried out while changing relative positions between the both, and the positions are set at a maximum intensity of the optical signals. However, such an alignment technique takes time, which reduces the productivity and yield of optical element modules for optically connecting a light receiving or emitting element and an optical fiber. In particular, the problem is significant in the case in which respective optical elements and the optical fibers are aligned to be optically connected to one another in an optical element array in which the plurality of optical elements are arrayed in parallel and the optical fiber array in which a plurality of optical fibers are likewise arrayed in parallel.

Further, as another problem, when an optical fiber is connected so as to be at an angle to a substrate on which an optical element and a semiconductor circuit element electrically connected thereto are disposed, in the case in which it is necessary to closely dispose a plurality of substrates, for example, as in a backplane, the optical fiber becomes a physical obstruction.

For such problems, an optical element module as shown in FIG. 20 is proposed. (A) in FIG. 20 is a side view thereof, and (B) in FIG. 20 is a cross section taken along B-B of FIG. 20(A). An optical element 8' and a semiconductor circuit element 9' are mounted on a front surface of a substrate 2', and those are electrically connected to a metal circuit on the front surface of the substrate 2' via bumps 52'. A V groove 2B' is formed at the front surface side of the substrate 2' likewise, and an optical fiber 7' is disposed in the V groove 2B'. A mirror surface 2a' at 45 degrees formed on the front surface side of the substrate likewise is formed in an optical connection path between the optical fiber 7' and the optical element 8'.

Then, the optical element 8' is disposed at a predetermined position by connection via bumps 52' with flip-chip bonding or the like, and the optical fiber 7' is disposed at a predetermined position by the V groove, which makes it possible to carry out positioning of the light receiving or emitting part of the optical element and the optical fiber without carrying out an active alignment as described above. Further, because the substrate 2' on which the optical element 8' and the semiconductor circuit element 9' are mounted and the optical fiber 7' are parallel to one another, even when a plurality of the substrates 2' are closely disposed, the optical fiber 7' does not interfere with installation in any case.

Then, in Patent Document 1, there is disclosed a method in which crystal anisotropic etching is utilized for forming a V groove or the like in a substrate of an optical element module as described above. Patent Document 1: Japanese Patent Application Laid-Open No. 2005-10766

SUMMARY OF THE INVENTION

However, in the optical element module as in FIG. 20, because the optical fiber 7' is also disposed on the front surface which is the same surface of the substrate 2' along with the optical element 8' and the semiconductor circuit element 9', even if any one of those is incorporated into the substrate 2' in advance, at the time of the latter incorporation, the member incorporated in advance thereof may become an obstacle or the member incorporated in advance thereof may be damaged. In particular, with respect to the optical element 8' and the semiconductor circuit element 9', in some cases, those are airtight-sealed with a hermetic package in which those are incorporated into a package to encapsulate an inactive gas in order to avoid an effect of its external environment, or the like, however, because of the optical fiber 7' closely disposed on the same surface, a package independent of the optical fiber is difficult. When an attempt is made to incorporate the optical fiber simultaneously in the package, problems in the reliability in sealing and in cost are brought about.

Further, in view of the case in which a light is transmitted from the optical fiber 7' to the optical element 8', the light is emitted into the air from the optical fiber 7', and reflected by the mirror surface 2a' to be made to enter into the optical element 8'. Then, in the propagation of the light through the respective boundaries and in the air, reflection and diffusion of light are caused. For example, in the case in which a clad diameter of the optical fiber 7' is 125 µm, a distance in the air of a light, which is emitted from the end of the optical fiber 7' to be reflected by the mirror surface 2a' inclined at 45 degrees, and enters into the optical element 8', is 125 µm at a minimum, which causes considerable light diffusion although it differs according to a core diameter and a numerical aperture. In particular, in the case of a multi-mode optical fiber, in order to prevent a part of a reflected light by the mirror surface 2a' from illuminating the optical fiber 7' due to a large diffusion of a beam diameter, it is necessary to further separate the optical fiber 7' from the mirror surface 2a', which further increases a distance up to incoming of light.

On the other hand, in Patent Document 1, there is disclosed that crystal anisotropic etching is adopted for forming a V groove and the like in the manufacture of a substrate of those optical element modules. However, it is merely devised that formation of a groove by crystal anisotropic etching is stopped by utilizing another dry etching or the like, and that etching onto a plurality of portions is efficiently carried out or the like by use of the specificity of crystal anisotropic etching is not considered.

The present invention has been achieved in order to solve the above-described problems, and an object of the present invention is to provide an optical element module including an optical element that receives light or emits light, a semiconductor circuit element, and an optical fiber optically connected to the optical element, the optical element module highly-functionally performs an optical connection between the optical element and the optical fiber, and provide a method of efficiently manufacturing the optical element module.

In accordance with the present invention, there is provided a method of manufacturing an optical element module in which an optical element and a semiconductor circuit element are mounted on one surface of a front surface and a rear surface of a silicon substrate, a mirror surface inclined at approximately 45 degrees to the one surface and the other surface is formed on the other surface, and an optical fiber facing the mirror surface is disposed in a V groove formed along the other surface, the method of manufacturing the optical element module including the steps of forming the mirror surface and V-shaped side surfaces of the V groove simultaneously by first crystal anisotropic etching on the other surface, and forming an attaching surface substantially perpendicular to the one surface and the other surface, which is formed at an end side of the V groove, and for attaching an end of the optical fiber, by second crystal anisotropic etching in a crystal plane orientation different from that of the first crystal anisotropic etching.

In accordance with the method of manufacturing the optical element module of the present invention, it is possible to efficiently, simultaneously, and precisely form the mirror surface at approximately 45 degrees and the V-shaped side surfaces of the V groove for carrying out positioning to dispose the optical fiber in the same surface of the silicon substrate, by one-time crystal anisotropic etching. Further, the perpendicular attaching surface, for attaching the end of the optical fiber and carrying out positioning of the end of the optical fiber at the end side of the V groove, is formed by the crystal anisotropic etching in the other crystal plane orientation, which makes it possible to easily form the attaching surface so as to be at a predetermined angle to the mirror surface and the V-shaped side surfaces.

In accordance with the present invention, there is provided an optical element module including a silicon substrate in which an optical element and a semiconductor circuit element are mounted on one surface of a front surface and a rear surface thereof, and an optical fiber is mounted on the other surface, the optical element and the semiconductor circuit element which are mounted on the one surface and are connected to a metal wiring formed on the one surface via bumps, and the optical fiber which is mounted along the other surface on the other surface, and in which, on the other surface of the silicon substrate, a mirror surface inclined at approximately 45 degrees to the one surface and the other surface, a V groove for carrying out positioning to dispose the optical fiber facing the mirror surface along the other surface, and an attaching surface substantially perpendicular to the one surface and the other surface, which is formed at an end side of the V groove, and for attaching an end of the optical fiber, are formed, and on the one surface of the silicon substrate, an optical guide including a cylindrical hole extending in a substrate thickness direction from the one surface is formed between a light receiving part or a light emitting part of the optical element and the mirror surface.

In accordance with the optical element module of the present invention, because the surface on which the optical element and the semiconductor circuit element are mounted and the surface on which the optical fiber is mounted, are different surfaces as the front surface and the rear surface of the substrate, it is possible to respectively incorporate those into the substrate independently. In particular, the above module may be configured such that, in a state in which semiconductor devices of an optical element and a semiconductor circuit element are mounted on one surface of a substrate, and the surface is airtight-sealed to be protected with a hermetic package or the like, it is possible to incorporate an optical fiber into the other surface.

Further, because an optical transmission path between the optical fiber and the optical element hardly passes through the air, and is capable of passing through the inside of the silicon substrate, it is possible to prevent light diffusion as in the air. Additionally, because the optical guide composed of a cylindrical hole is formed in the silicon substrate between the mirror surface at 45 degrees and the light receiving or emitting surface of the optical element, it is possible to prevent light from diffusing to the outside of the optical guide due to a difference in light refractive index between silicon and the air, and even when the substrate is thick, efficient optical transmission is possible.

In accordance with the optical element module and the method of manufacturing the optical element module, it is possible to precisely and efficiently manufacture an optical element module in which an optical element and a semiconductor circuit element are mounted on one surface of a silicon substrate, a mirror surface inclined at approximately 45 degrees is formed on the other surface, and an optical fiber facing the mirror surface at approximately 45 degrees thereto is disposed in a V groove formed along the other surface.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

Figure 1:
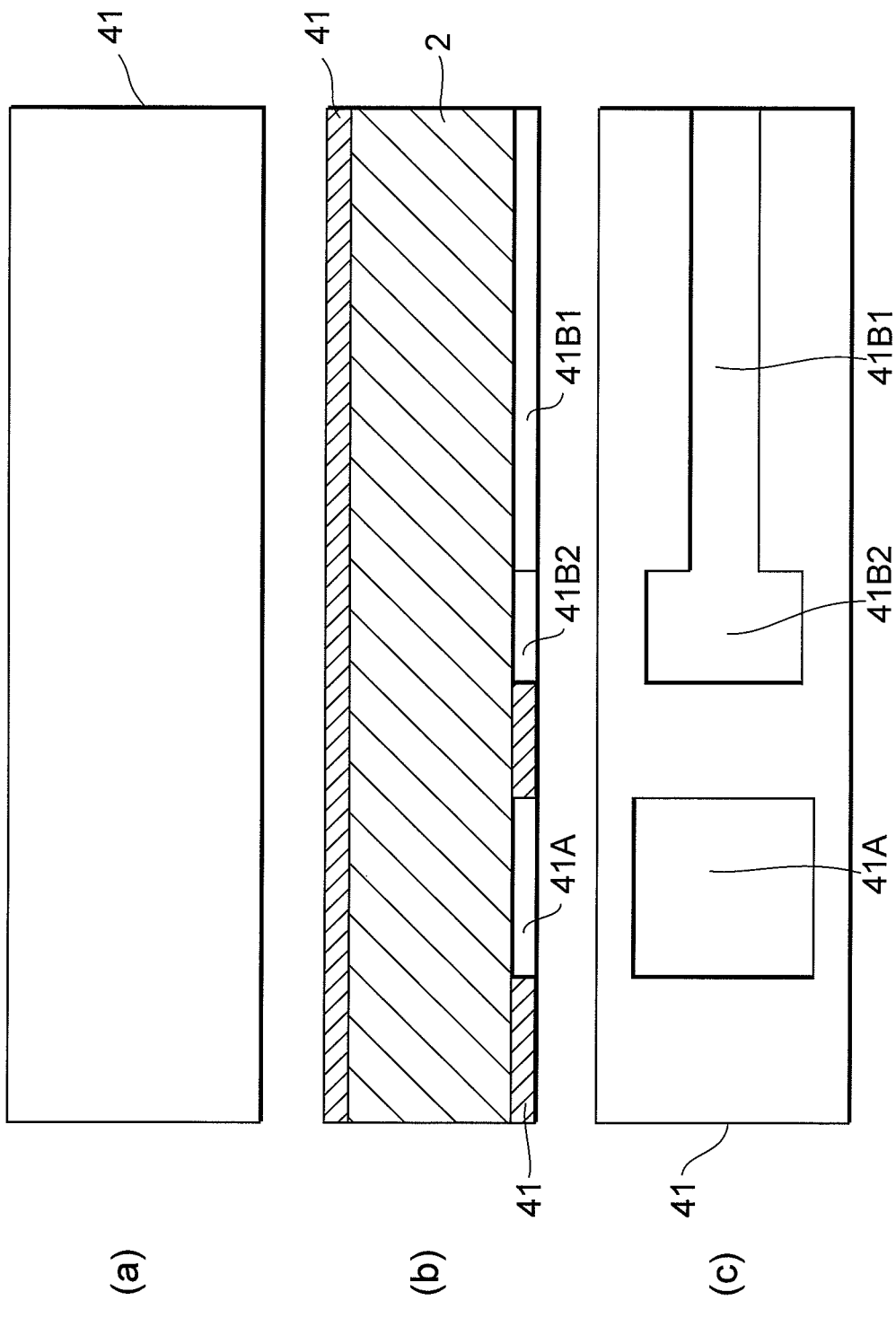
FIG. 1 is a schematic diagram showing a part of a method of manufacturing an optical element module according to a first embodiment.

Hereinafter, preferred embodiments of the present invention will be described in detail with reference to the accompanying drawings. Note that, in the description, same components or elements having the same functions are denoted by the same reference numerals and letters, and overlapping descriptions will be omitted.

FIGS. 1 to 13 are diagrams for explanation of a method of manufacturing according to a first embodiment of the present invention. Note that, in the respective drawings, views (a) show respective front surfaces viewed from above, views (b) show respective longitudinal sections in their central parts, and views (c) show rear surfaces viewed from underneath.

First, a completed optical element module 1 will be described with reference to FIG. 13. A silicon oxide film ($SiO_2$) 4 serving as an insulating film is formed on a front surface of a silicon substrate 2, and a metal wiring 5 having a predetermined shape is disposed on an upper surface thereof. A passivation film 6 is formed on an upper surface of the metal wiring, and the metal wiring 5, and an optical element 8 and a semiconductor circuit element 9 are electrically connected via bumps 52 located at openings of the passivation film.

The optical element 8 is a light receiving element such as a photodiode or a light emitting element such as a surface emitting laser. When the optical element 8 is a light receiving element, the semiconductor circuit element 9 is, for example, an amplifier circuit, and when the optical element 8 is a light emitting element, the semiconductor circuit element 9 is, for example, a driving circuit for laser oscillation. These optical element 8 and semiconductor circuit element 9 are mounted on the front surface side of the silicon substrate 2.

On the other hand, a silicon nitride film ($Si_3N_4$) 3 is formed on a rear surface of the silicon substrate 2, and a portion 3a thereof functions as an antireflection film. Further, the silicon oxide film 4 which is the same as that on the front surface is formed on an upper surface thereof.

Then, a depressed portion for mirror surface formation 2A is formed on the rear surface, and a surface on the right side in the drawing is a mirror surface 2a. The mirror surface 2a is formed so as to be inclined at 45 degrees to the front surface and the rear surface of the substrate. Further, naturally, the mirror surface 2a is inclined at 45 degrees to the thickness direction of the substrate 2 as well. An optical fiber 7 is disposed so as to face the mirror surface 2a with its end. The optical fiber 7 is installed in a V groove formed on the rear surface of the silicon substrate 2 in a state in which its end is attached to an attaching surface 2b formed to be perpendicular to the front surface and the rear surface in the silicon substrate 2.

An optical guide 2C composed of a cylindrical hole extending in the substrate thickness direction from the front surface of the silicon substrate 2 is formed at the front surface side of the silicon substrate 2 between a light receiving part or a light emitting part of the optical element 8 and the mirror surface 2a. Further, an antireflection film 3b composed of a silicon nitride film which is the same as the antireflection film 3a on the surface of the perpendicular surface 2b is formed on the front surface of the silicon substrate in the optical guide 2C.

Figure 13:
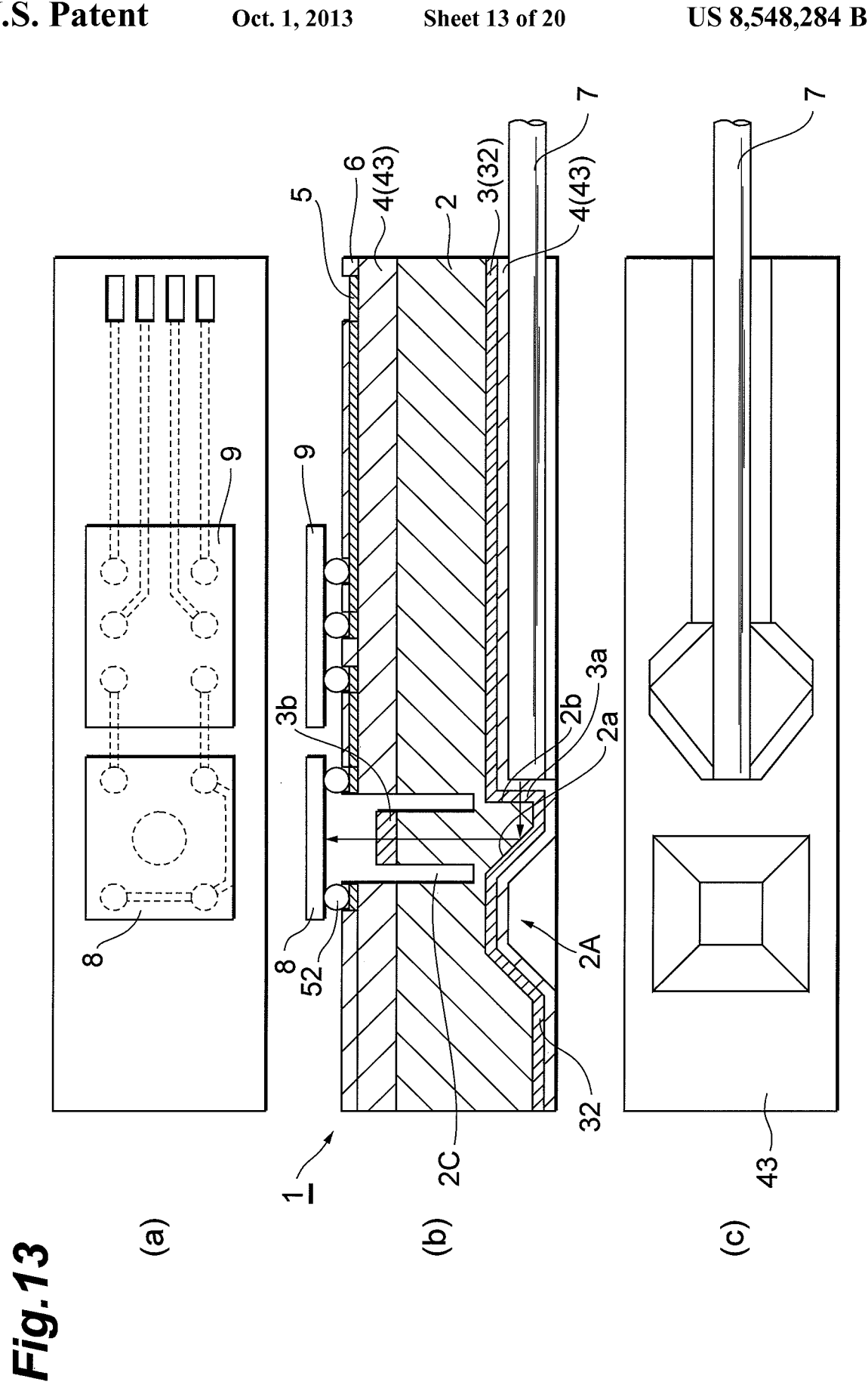
FIG. 13 is a schematic diagram of an optical element module manufactured by manufacturing methods in respective embodiments.

In the example shown in FIG. 13, the optical element 8 is a light receiving element, and the light is shown by an arrow assuming that a light emitted from the optical fiber 7 is reflected by the mirror surface 2a inclined at 45 degrees, to pass through the inside of the optical guide 2C to enter into the light receiving part of the optical element 8. Here, the front surface and the rear surface of the substrate 2 may be reversed. Further, the front surface and the rear surface are not necessarily perfectly parallel to one another, and both of the inclined angle of the mirror surface 2a and the angle of the attaching surface 2b are not necessarily perfectly 45 degrees and perpendicular, and may be approximately 45 degrees and within a range of being substantially perpendicular.

Next, an example for steps of manufacturing the optical element module 1 will be described with reference to FIGS. 1 to 13. As the silicon substrate 2, a (100) silicon single crystal whose both sides are polished is used. Here, the (100) silicon single crystal is prepared such that the front and rear surfaces become (100) crystal planes. After silicon oxide films 41 are formed on the front surface and the rear surface of the silicon substrate 2 by thermal oxidation, openings as shown in FIG. 1 are formed in the silicon oxide film 41 at the rear surface side by lithography. For that purpose, resist is applied to the surface of the silicon oxide film 41 at the rear surface side and the openings are formed in the resist film, and then the silicon oxide films 41 on the portions of the openings are removed by dry etching, and the resist film is further eliminated.

Here, an opening 41A is an opening for forming a depressed portion for forming a mirror surface in the silicon substrate 2 by first crystal anisotropic etching, and an opening 41B1 is an opening for forming a V groove at the same time. Further, an opening 41B2 is an opening for forming an attaching surface perpendicular to the silicon substrate by second crystal anisotropic etching thereafter. These openings are set such that the lateral direction lines of right and left in the drawing of the respective openings in FIG. 1(c) correspond to the crystal <100> orientation. For that purpose, when an orientation flat plane of the silicon substrate 2 is a (110) plane, it is preferable that the lateral direction line be set such that an angle with a line perpendicular to the plane becomes 45 degrees.

Figure 2:
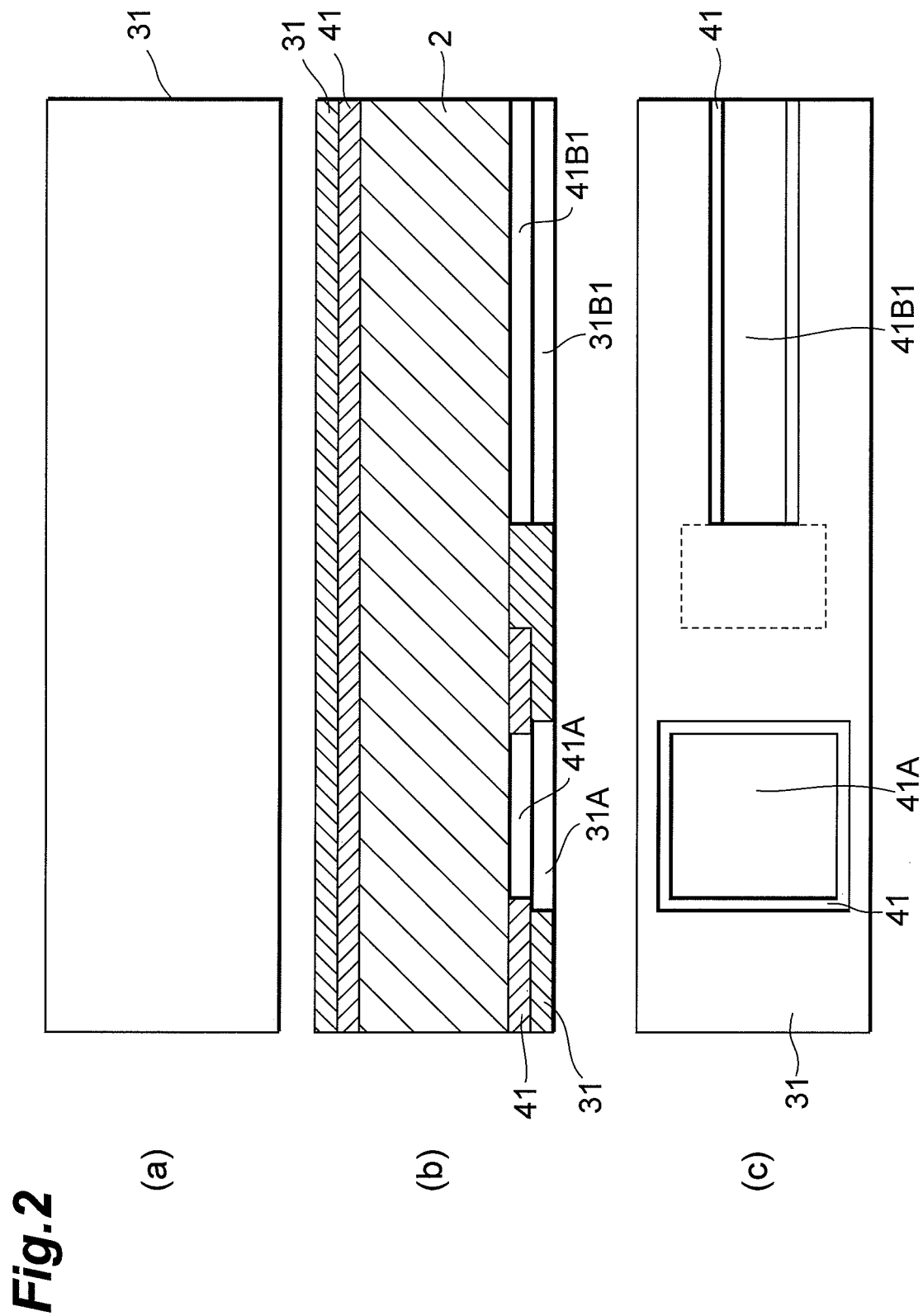
FIG. 2 is a schematic diagram showing a part of the method of manufacturing the optical element module according to the first embodiment.

Next, silicon nitride films 31 as in FIG. 2 are formed on the upper surfaces of the silicon oxide films 41. For that purpose, the silicon nitride films 31 are formed overall onto the front surface and the rear surface of the silicon substrate 2 by low-pressure chemical vapor deposition (LP-CVD), and after resist is applied to the surface thereof, and openings are formed in the resist film, the silicon nitride films 31 on the portions of the openings are removed by dry etching, and the resist film is further eliminated.

Here, because an opening 31A is formed so as to be greater than the opening 41A in the silicon oxide film 41 formed in advance, the peripheral portion of the opening 41A in the silicon oxide film 41 is exposed. Further, because an opening 31B1 is formed so as to be greater than the width of the opening 41B1 in the silicon oxide film 41 formed in advance, the peripheral portion in the width direction of the opening 41B1 in the silicon oxide film 41 is exposed. Note that the opening 41B2 in the silicon oxide film 41 is covered with the silicon nitride film 31.

Figure 3:
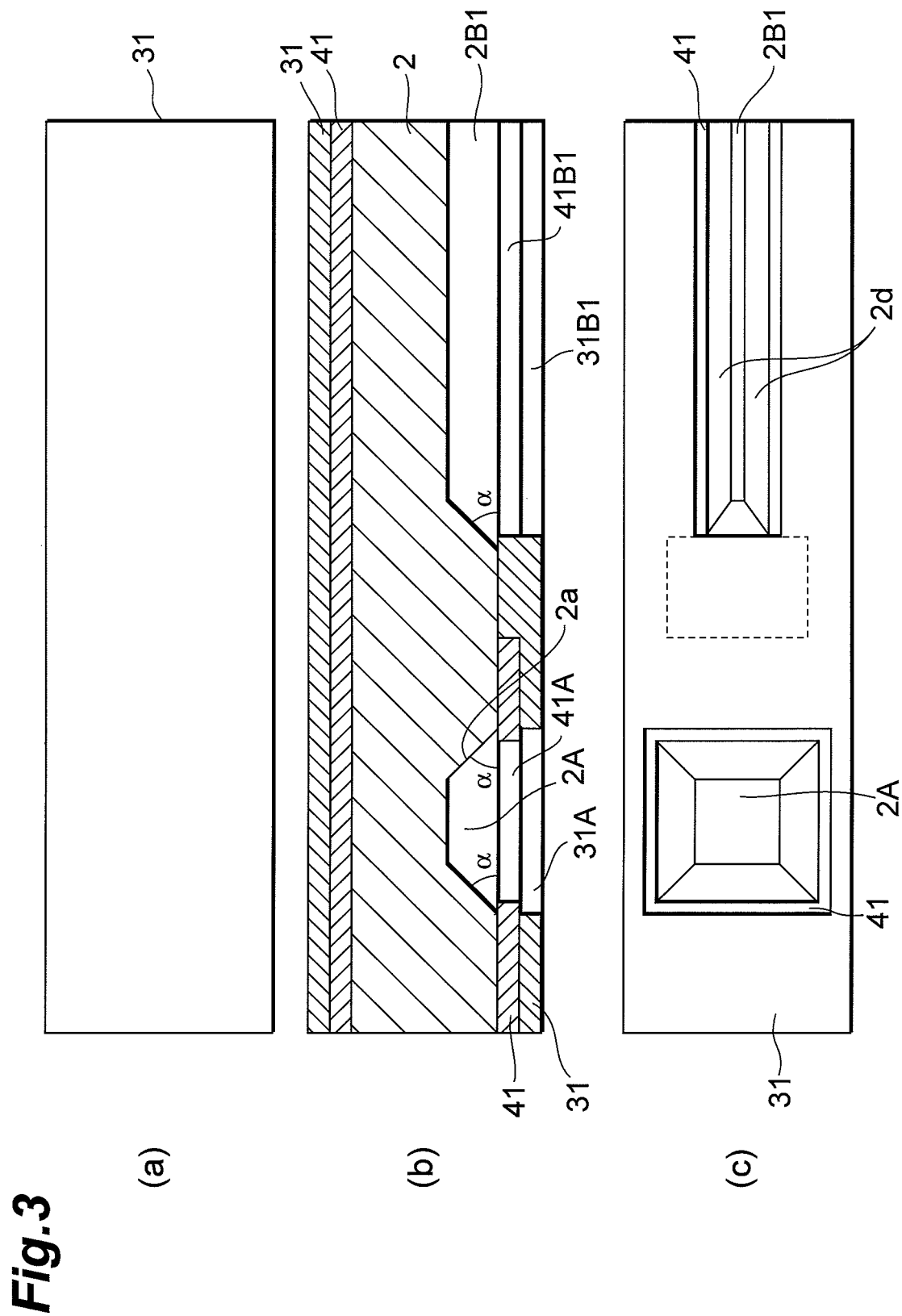
FIG. 3 is a schematic diagram showing a part of the method of manufacturing the optical element module according to the first embodiment.

Next, as shown in FIG. 3, the depressed portion for mirror surface formation 2A and the V groove portion 2B1 are formed by crystal anisotropic etching (the first crystal anisotropic etching) with respect to the silicon single crystal. Note that, in the following description, when the (100) plane, (010) plane, and (001) plane of a crystal are expressed as being equivalent without distinction, those are described as a {100} plane. This is the same with respect to a {110} plane and a {111} plane.

Normally, in crystal anisotropic etching onto a (100) silicon single crystal, because an etching rate for a {111} plane is lowest, when applying etching with an opening of a line crossing a {111} plane, a {111} plane inclined at 54.7 degrees to the {100} plane makes its appearance. However, when the openings 41A, 41B1, and 41B2 are set in the direction as described above, the line of the openings does not cross the {111} plane in any case, and the {111} plane does not make an appearance due to crystal anisotropic etching. Then, etching rates for a {100} plane and a {110} plane are different according to an etchant to be used, therefore, it is possible to make an appearance of a {100} plane or a {110} plane with a lower etching rate by selecting an etchant.

In the first crystal anisotropic etching, etching to make an appearance of a {110} plane is performed by use of EPW (a mixed liquid of ethylenediamine, pyrocatechol, and water) or hydrazine ($N_2H_4 \cdot H_2O$) as an etchant. It is possible to form a {110} plane by use of a mixed liquid of potassium hydroxide (KOH) and isopropyl alcohol (IPA) as well, as an etchant. In the present embodiment, the silicon oxide film is used as a mask for the rims of the openings 41A and 41B1, and the silicon oxide film is eroded by KOH. Therefore, in the case in which a mixed liquid of KOH and IPA is used, it is preferable that the silicon oxide film is made to have a thickness of 0.5 μm or more with respect to etching of 100 μm, to be a thick silicon oxide film, or the silicon oxide film 41 is covered with the silicon nitride film 31 as in a second embodiment which will be described later, which makes the silicon nitride film 31 function as a mask.

Here, not only the mirror surface 2a, but also the attaching surface 2b through which light passes and the V-shaped side surfaces 2d for carrying out lateral positioning of the optical fiber are required to be flat and smooth mirror finished surfaces. For that purpose, when EPW is used as an etchant in the first crystal anisotropic etching and the second crystal anisotropic etching which will be described later, a solution for low-speed etching is preferably used, and etching at a low temperature is preferable. Further, in the case of making an appearance of a {110} plane by use of a mixed liquid of KOH and IPA, etching at a high concentration of 30% or more by weight of KOH and at a temperature of approximately 60° C. is preferable from the standpoint of suppressing an appearance of hillocks (protrusions generated by etching) as well.

Because the {110} plane formed by etching in this step has an inclination of 45 degrees to the {100} plane, as shown in FIG. 3, both of the peripheral surfaces of the depressed portion for mirror surface formation 2A and the V groove portion 2B1, to which the etching has been applied, have an inclination of 45 degrees as shown by α. Then, the inclined surface at 45 degrees at the side of the V groove portion 2B1 of the depressed portion for mirror surface formation 2A becomes the mirror surface 2a, and the inclined surfaces at 45 degrees in the width direction (the vertical direction in FIG. 3(c)) of the V groove portion 2B1 become the V-shaped side surfaces 2d for carrying out positioning of the optical fiber to dispose it.

Here, it is a matter of course that because the etching for the depressed portion for mirror surface formation 2A and the V groove portion 2B1 is achieved by the same one-time etching, and is performed with the equivalent crystal plane, that is efficient, and, further, even in the case in which etching is applied more than the initial setting or less than the setting according to an etchant, an etching time, a temperature, and the like, the depths of the depressed portion for mirror surface formation 2A and the V groove portion 2B1 always become substantially the same. Therefore, relative positions of the optical fiber and the mirror surface, when an optical fiber is disposed in the V groove, are substantially the same, and from this standpoint as well, it is easy to carry out positioning of an optical fiber.

Figure 4:
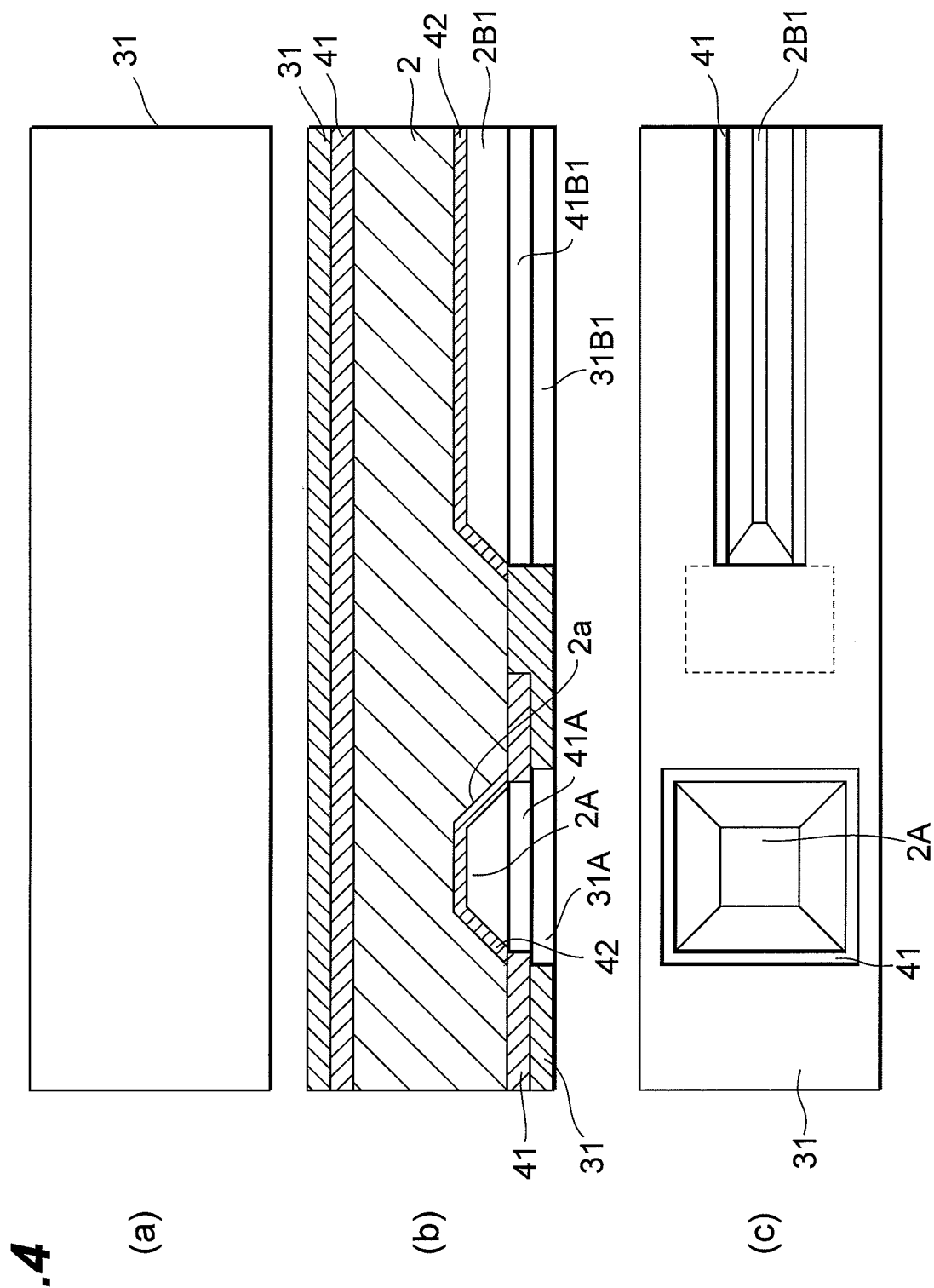
FIG. 4 is a schematic diagram showing a part of the method of manufacturing the optical element module according to the first embodiment.
Figure 5:
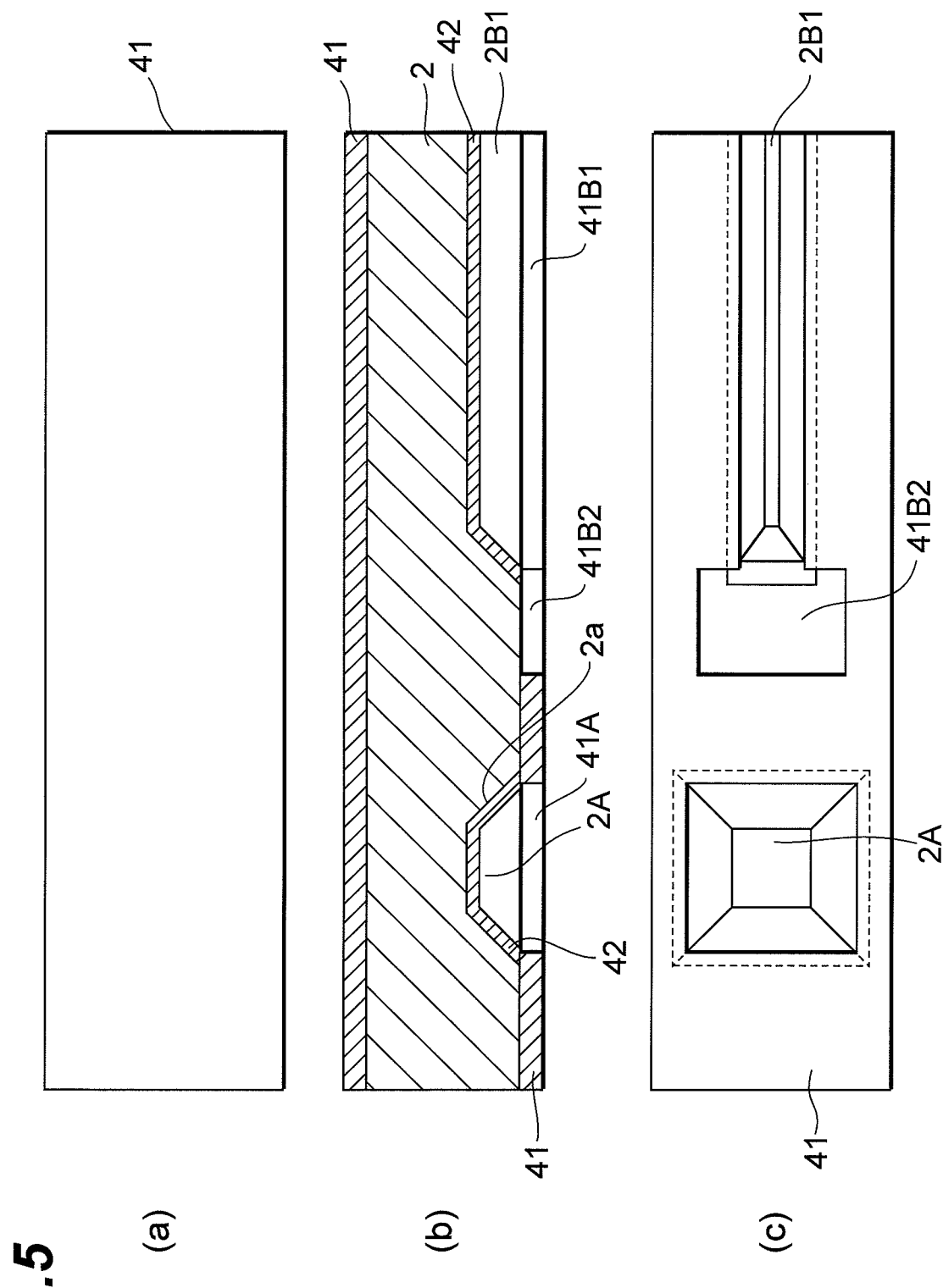
FIG. 5 is a schematic diagram showing a part of the method of manufacturing the optical element module according to the first embodiment.

Next, as shown in FIG. 4, silicon oxide films 42 are formed on the respective inner faces of the depressed portion for mirror surface formation 2A and the V groove portion 2B1 which have made their appearances by the etching, by thermal oxidization. This is for protecting these surfaces from being subjected to etching in the second crystal anisotropic etching in the following step. Thereafter, by eliminating the silicon nitride film 31 with thermal phosphoric acid, the silicon oxide film 41 as an under layer makes its appearance on the surface, and the opening 41B2 already formed at the stage of FIG. 1 makes its appearance again as shown in FIG. 5. This opening 41B2 is used as a mask at the time of the second crystal anisotropic etching to form the perpendicular attaching surface 2b.

Here, if such a mask is not formed, but a one-layer mask only for that purpose is used in the first crystal anisotropic etching to form the depressed portion for mirror surface formation 2A and the V groove portion 2B1 in the previous step, it is necessary to newly form a mask shown in FIG. 5 in the second crystal anisotropic etching to form the perpendicular surface in the following step.

For that purpose, first, a silicon oxide film is formed on the surface of the silicon substrate 2, and thereafter, resist for lithography is to be applied to the upper surface overall. However, in the case in which a depressed portion is already formed on the surface by the first crystal anisotropic etching in the previous step as in the present embodiment, it is difficult to apply resist thereto. Normally, in an application of resist, a substrate is rotated by a spin coater, and resist is made to fall in drops on the substrate, to spread out the resist by its centrifugal force, which forms a resist film. For this reason, an application of resist is particularly difficult by such a normal method of applying resist.

In the present embodiment, a mask in which the silicon oxide film 41 and the silicon nitride film 31 are laminated is used as a mask for the step of the first crystal anisotropic etching. Then, in the second crystal anisotropic etching in the following step, a protective film is formed on a portion which has been etched in the previous step, that is to be protected, and the silicon nitride film 31 as an upper layer is further eliminated, to expose the opening 41B2 in the silicon oxide film 41 covered with the silicon nitride film 31 until then, which makes it possible to use the silicon oxide film 41 as a mask without newly forming a mask with a step of applying resist.

In the present embodiment, with respect to the mask for the two types of anisotropic etchings, the silicon nitride film and the silicon oxide film are prepared in advance in this way to achieve the mask. However, provided that the step of forming crystal planes at 45 degrees is carried out in advance of the step of forming a perpendicular surface, by use of a spray coater for an application of resist, a mask for forming a perpendicular surface may also be formed after forming crystal planes at 45 degrees.

Figure 6:
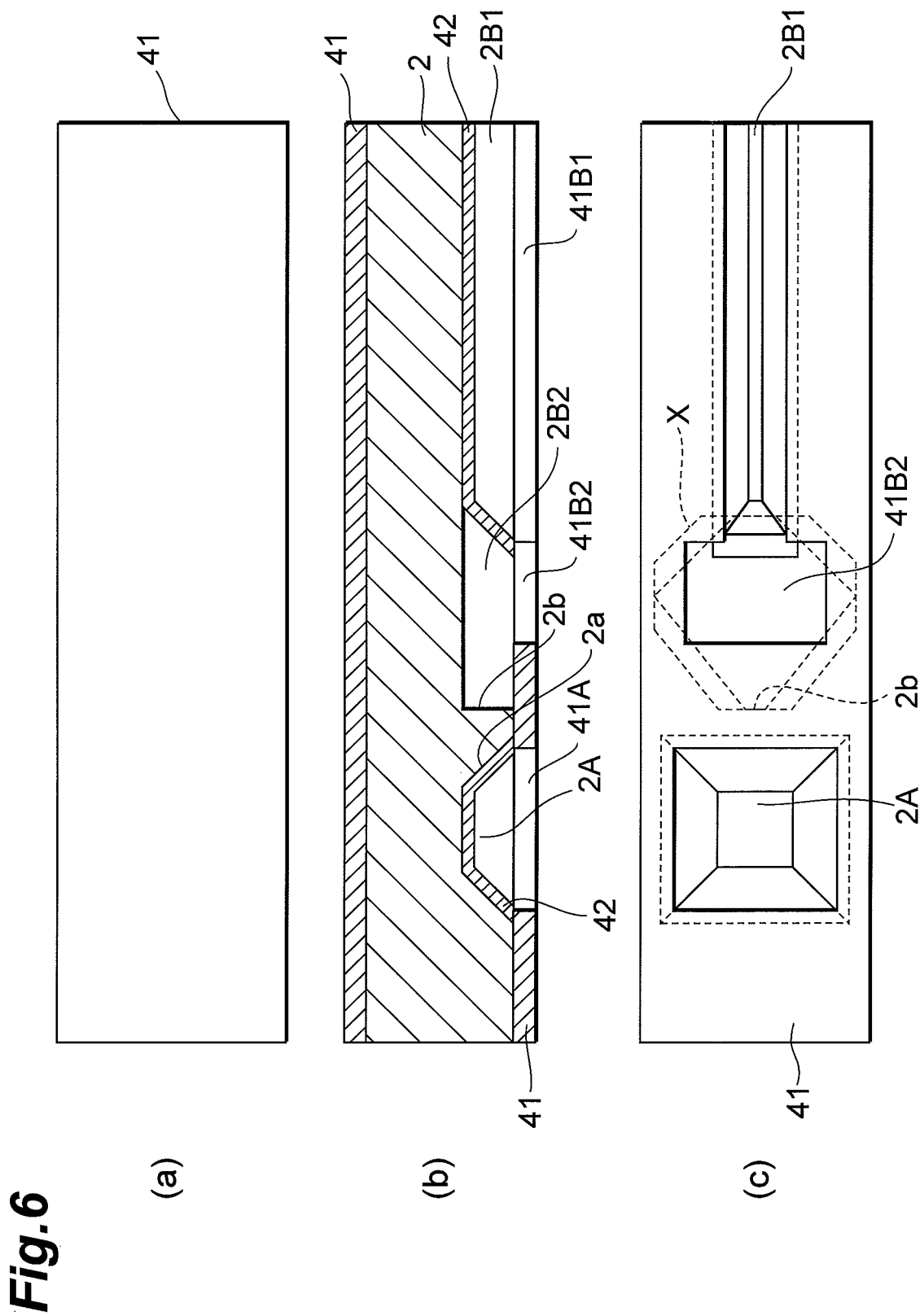
FIG. 6 is a schematic diagram showing a part of the method of manufacturing the optical element module according to the first embodiment.

Then, as shown in FIG. 6, the second crystal anisotropic etching to form the perpendicular attaching surface 2b for attaching an end of an optical fiber and carrying out positioning of the end of the optical fiber, is performed. Here, as an etchant, TMAH (tetramethylammonium hydroxide, $(CH_3)_4NOH$) with which an etching rate with respect to a {100} plane is made lower than that with respect to a {110} plane, is used. Additionally, etching to make an appearance of a {100} plane is possible by use of KOH (with which IPA is not mixed), CsOH, or the like as well.

As described in the first crystal anisotropic etching as well, the attaching surface 2b as well is required to be a flat and smooth mirror finished surface. When TMAH is used, it is preferable to apply etching at a high concentration of 22% or more by weight, and when KOH is used, in the same way as the condition that a mixed liquid with IPA is used in the first crystal anisotropic etching, etching at a high concentration of 30% or more by weight of KOH and at a temperature of approximately 60° C. is preferable from the standpoint of suppressing an appearance of hillocks, as well.

In this etching, essentially, etching from the opening 41B2 toward the thickness direction (depth direction) of the substrate 2 and etching in a direction in which the peripheral four sides at the opening 41B2 are expanded in FIG. 6(c) are applied, to form a rectangular parallelepiped portion for perpendicular surface formation 2B2, and a perpendicular surface facing the mirror surface 2a thereof becomes the attaching surface 2b for the end of the optical fiber. However, in practice, anisotropic etching making an appearance of a {111} plane as shown by the line X is advanced from the corner portions of the opening 41B2 of the mask. Therefore, in the present embodiment, in order to maintain the attaching surface 2b as wide as possible, in advance, the opening 41B2 is formed to be longer in a direction along the mirror surface 2a. Note that, a corner portion compensating method in crystal anisotropic etching may also be used in some cases.

Figure 7:
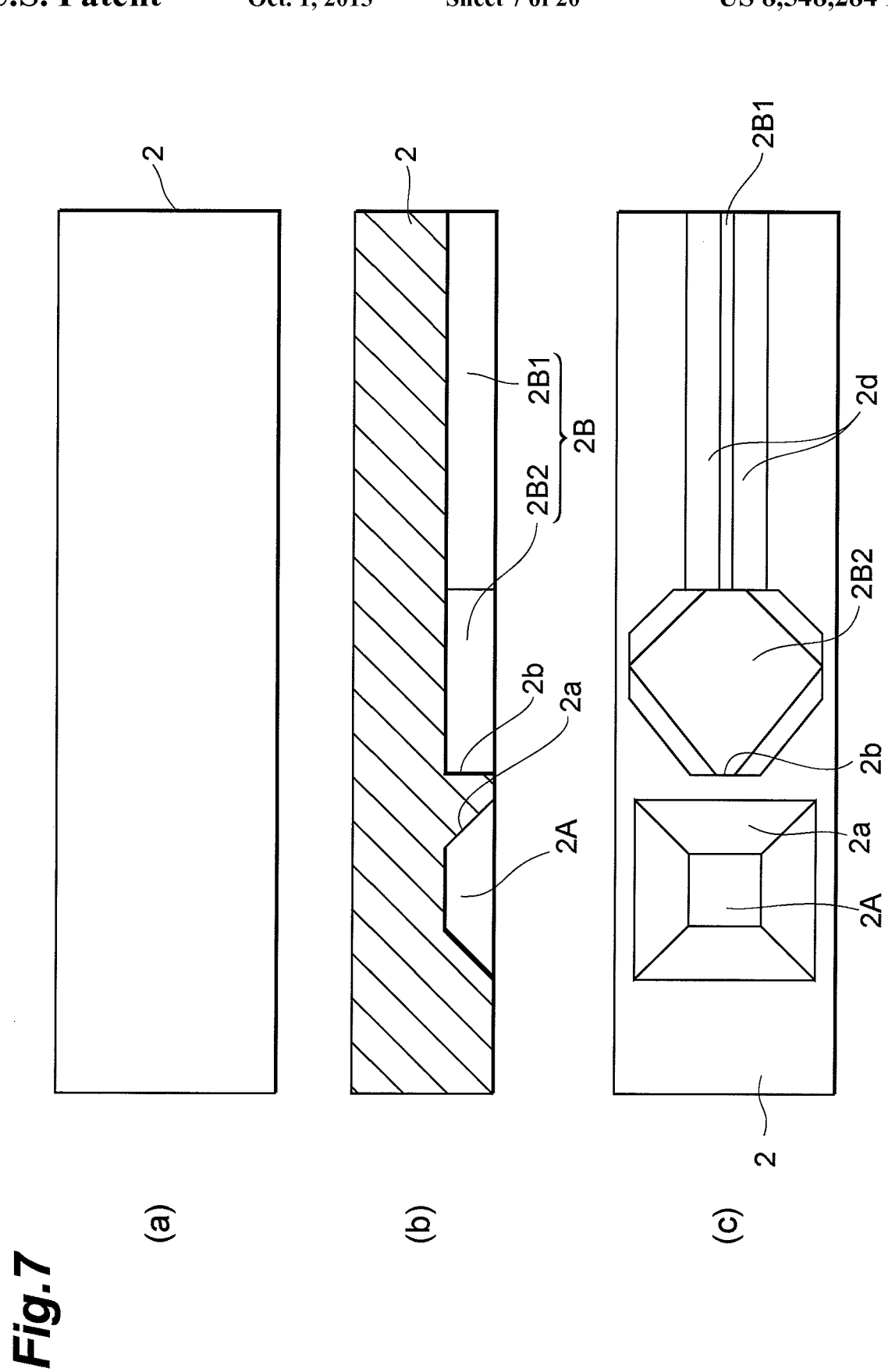
FIG. 7 is a schematic diagram showing a part of the method of manufacturing the optical element module according to the first embodiment.

Next, as shown in FIG. 7, the oxide film 41 on the surface of the substrate 2 is eliminated by hydrogen fluoride. In FIG. 7, the structure of the rear surface of the substrate 2 is completed, and the surface at 45 degrees at the side of the portion for perpendicular surface formation 2B2 of the depressed portion for mirror surface formation 2A is the mirror surface 2a, and the V groove portion 2B1 and the portion for perpendicular surface formation 2B2 are communicated with one another to form a guide groove 2B for an optical fiber. Then, the V-shaped side surfaces 2d of the V groove portion 2B1 carry out lateral positioning of an optical fiber, and the perpendicular surface facing the mirror surface 2a in the portion for perpendicular surface formation 2B2 becomes the attaching surface 2b for carrying out longitudinal positioning of the optical fiber.

Figure 8:
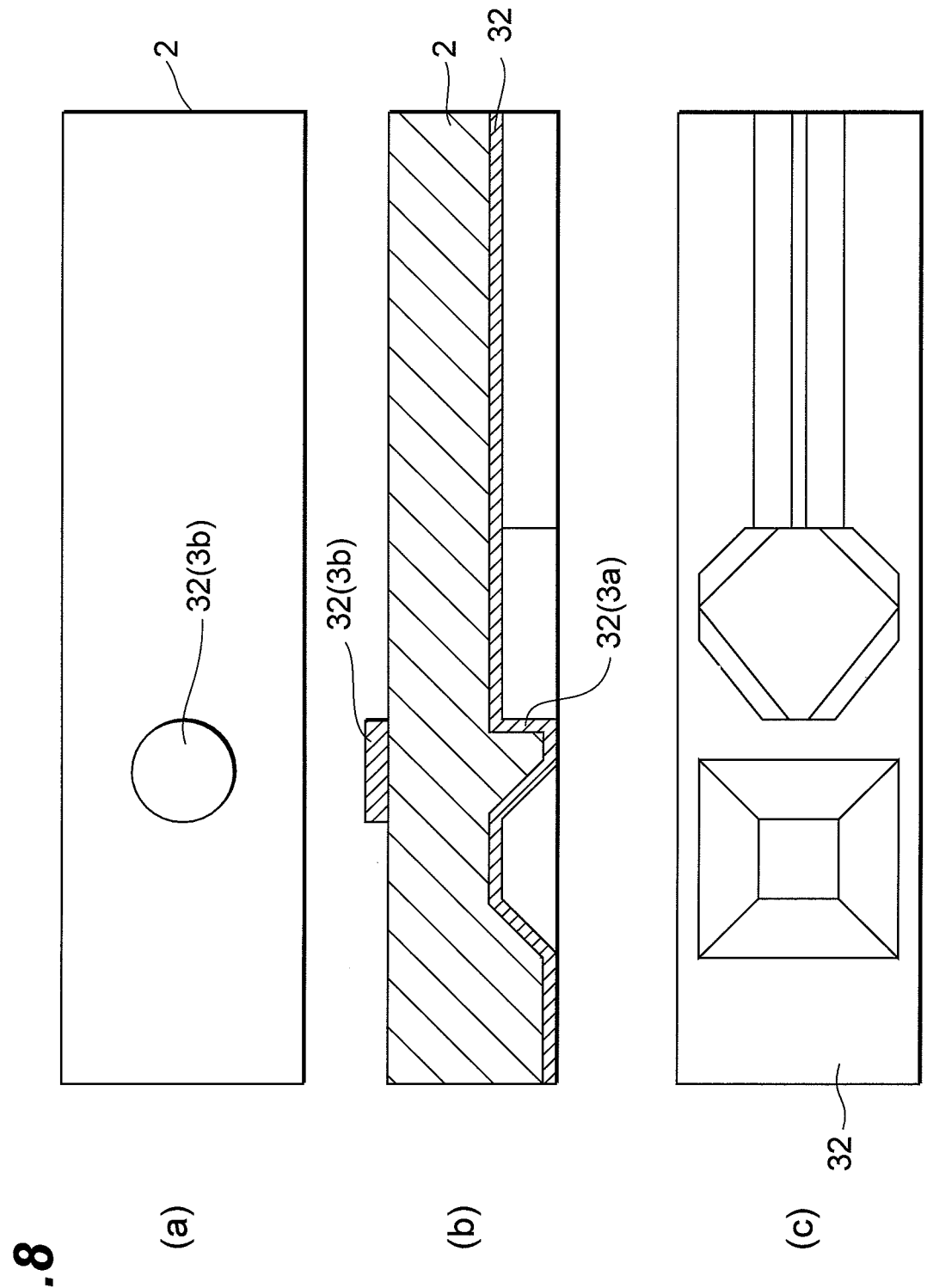
FIG. 8 is a schematic diagram showing a part of the method of manufacturing the optical element module according to the first embodiment.

Next, as shown in FIG. 8, the silicon nitride films 32 are formed on the entire rear surface and a portion of the front surface through which light passes, of the substrate 2. Here, because a silicon nitride film 3a on the portion of the attaching surface 2b at the rear surface side and a silicon nitride film 3b at the front surface side are made to function as antireflection films, those are formed so as to have a thickness of approximately ¼ of a wavelength (λ/4) of light to be used.

In order to form the silicon nitride films 32, the silicon nitride films 32 are formed overall onto the front surface and the rear surface of the substrate 2 by LP-CVD or plasma CVD. Then, resist is applied to the surface of the substrate 2, and patterning is applied to the resist film so as to leave only a portion corresponding to the silicon nitride film 3b, and further the silicon nitride film on the other portion is eliminated by dry etching.

Figure 9:
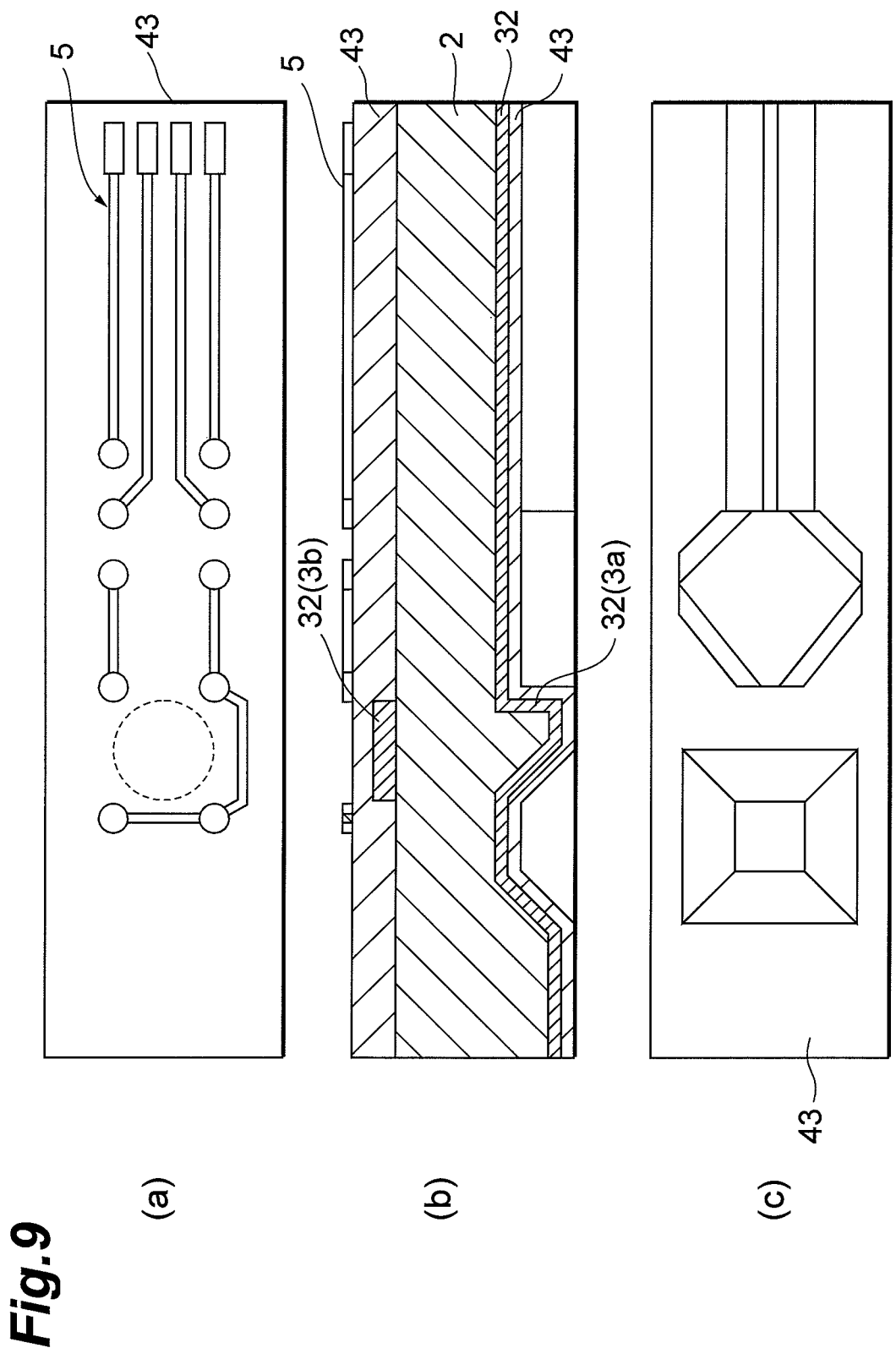
FIG. 9 is a schematic diagram showing a part of the method of manufacturing the optical element module according to the first embodiment.

Next, as shown in FIG. 9, silicon oxide films 43 are formed on the front surface and the rear surface of the substrate 2 by CVD, and the metal wiring 5 with a predetermined pattern is formed on its upper surface of the front surface. The silicon oxide film 43 at the front surface side formed in this step functions as an insulating film. Further, the silicon oxide film 43 may not be necessarily formed at the rear surface side, however, when the silicon oxide film is formed only on the front surface, warpage of the substrate 2 due to the film formation is brought about. For this reason, it is preferable to form a film on the rear surface as well such that the front and rear films are the same in thickness in order to minimize warpage.

Figure 10:
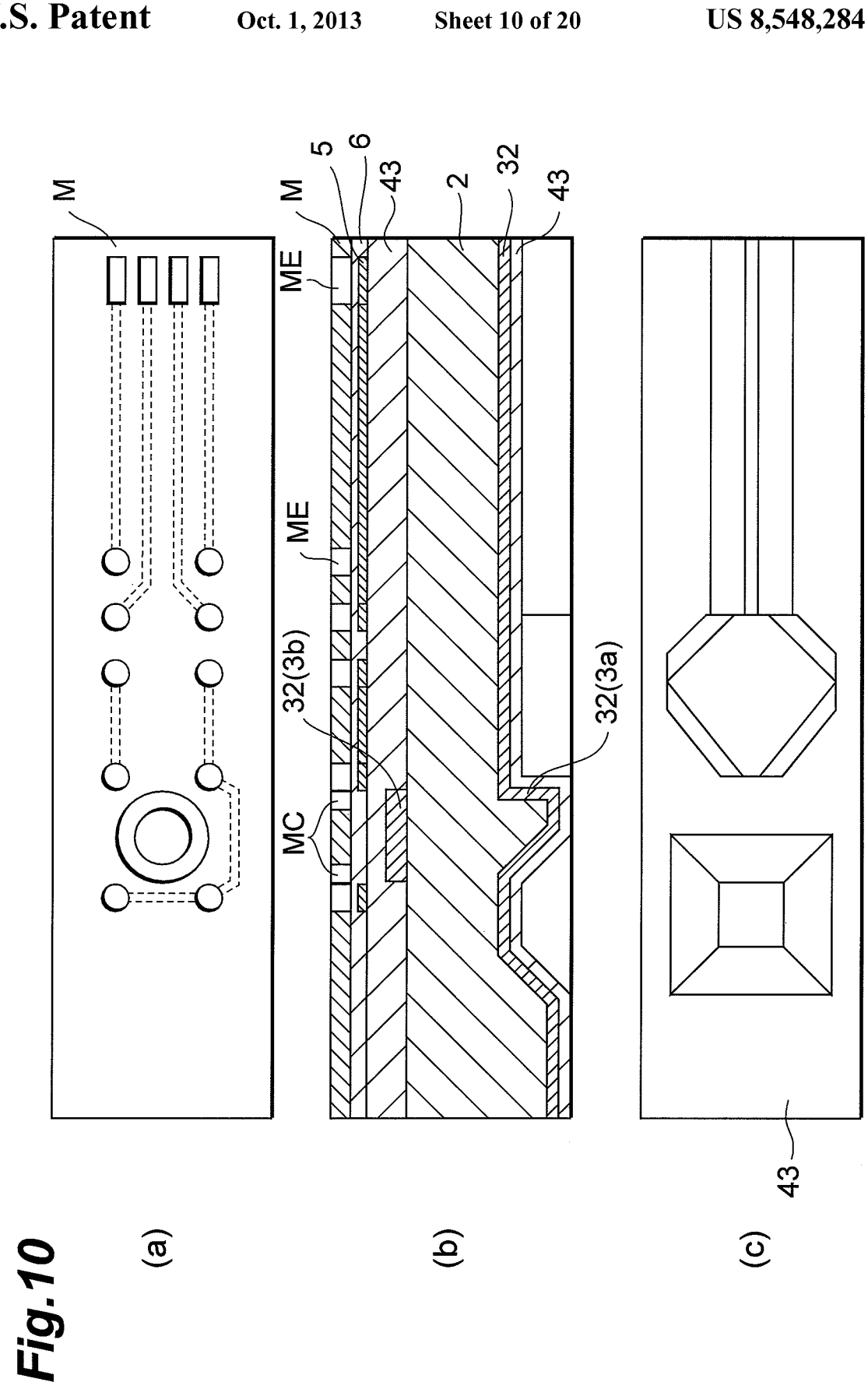
FIG. 10 is a schematic diagram showing a part of the method of manufacturing the optical element module according to the first embodiment.

Next, as shown in FIG. 10, the passivation film 6 primarily composed of a silicon oxide film is formed from above the metal wiring 5 on the front surface by CVD, and a resist mask M for forming electrodes for electrically connecting to the metal wiring 5 and the optical guide 2C is prepared thereon. For that purpose, patterning of openings ME corresponding to the electrode portions and an annular opening MC corresponding to the optical guide is applied to the applied resist film.

Figure 11:
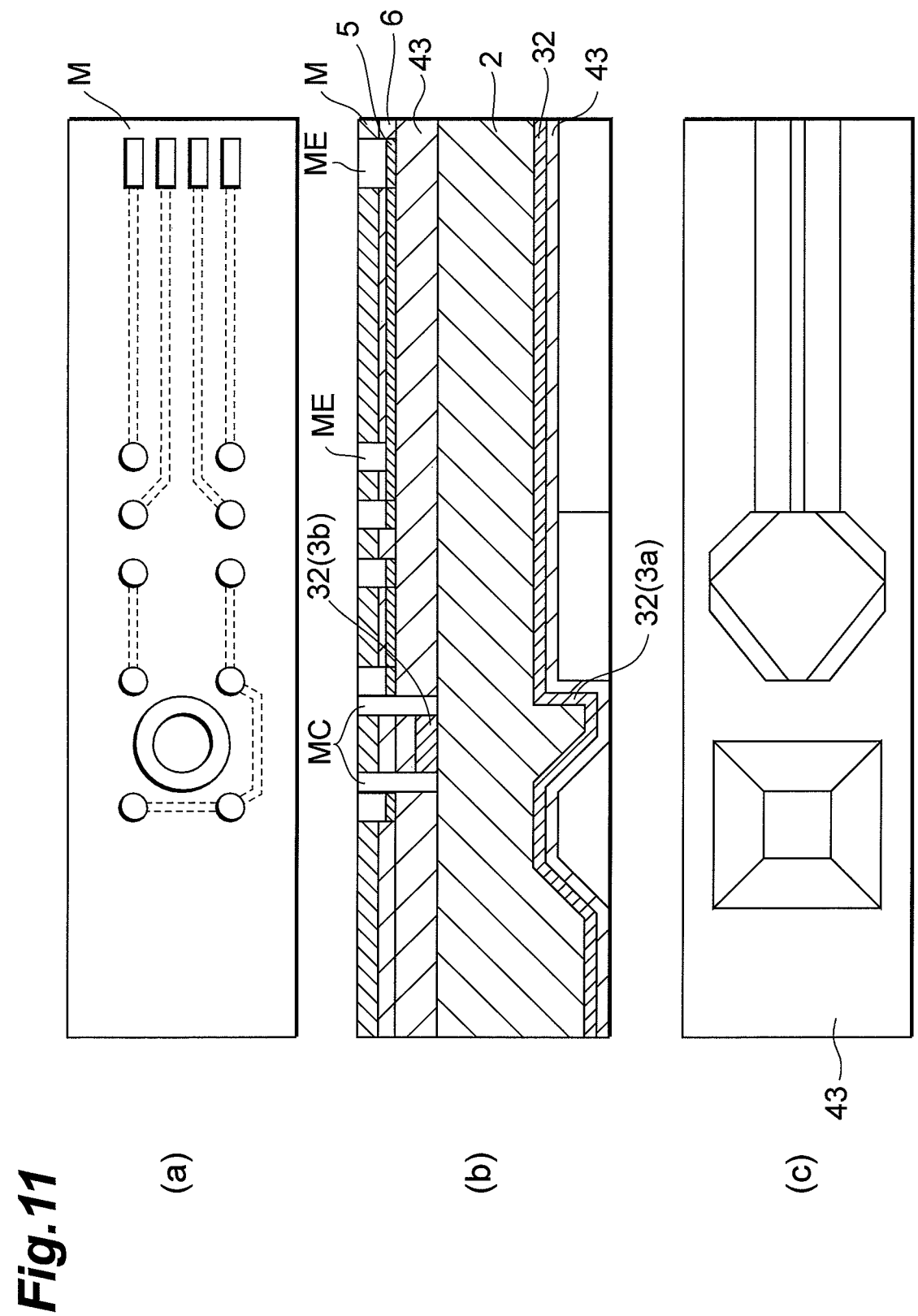
FIG. 11 is a schematic diagram showing a part of the method of manufacturing the optical element module according to the first embodiment.

Then, as shown in FIG. 11, dry etching through the opening portions of the mask M is applied to eliminate the passivation film 6 until the metal wiring 5 is exposed on the electrode portions. Further, on the portion of the optical guide, the passivation film 6 and the silicon oxide film 43 are eliminated until the silicon substrate 2 is exposed.

Figure 12:
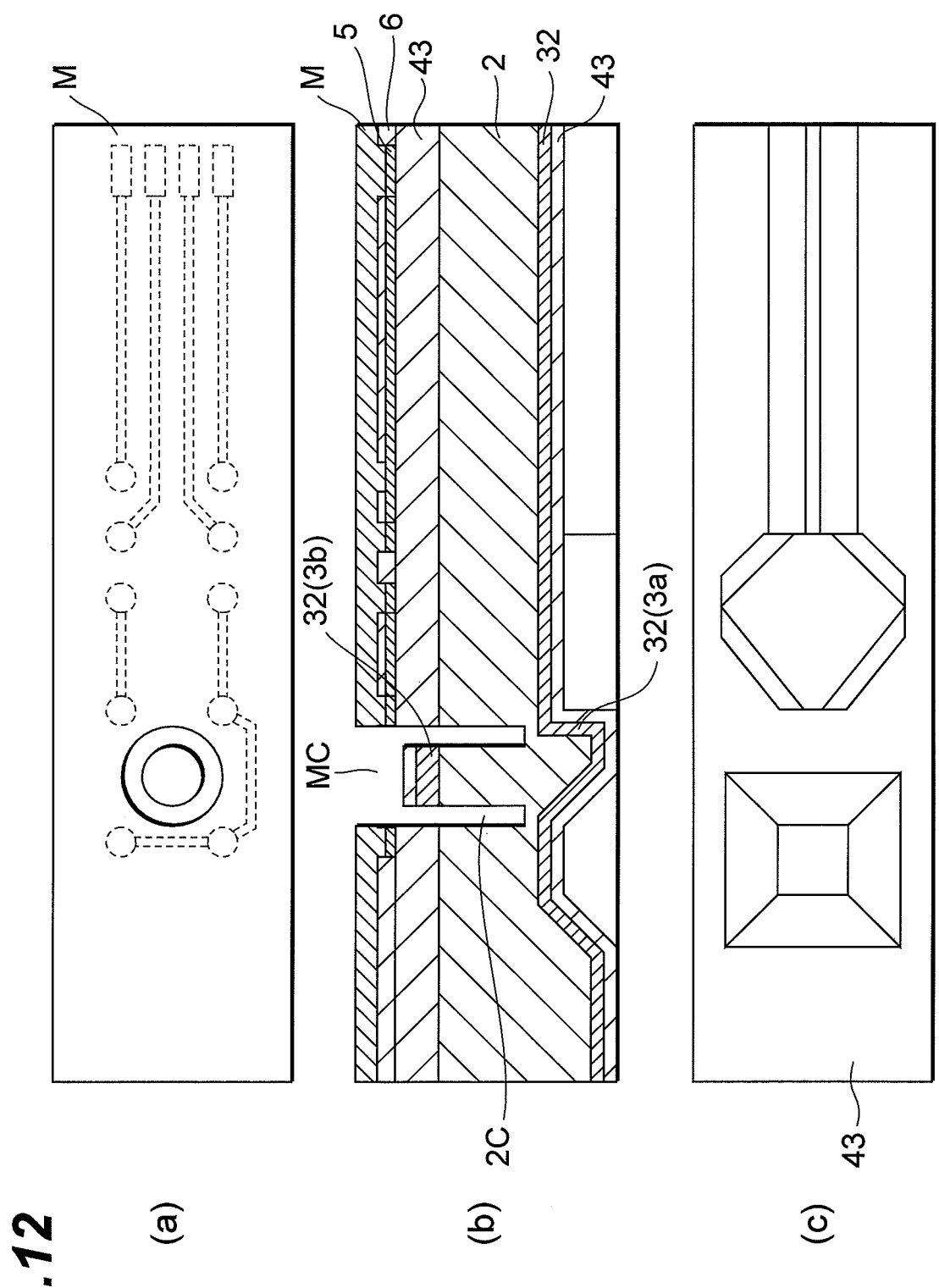
FIG. 12 is a schematic diagram showing a part of the method of manufacturing the optical element module according to the first embodiment.

Next, the resist film M is formed again, to form the mask M with the opening MC to expose the optical guide portion in, not an annular shape, but a circular form, and from that state, deep dry etching onto the silicon substrate 2 is applied as shown in FIG. 12, to form the optical guide 2C. At this time, the circular-form silicon oxide film 43 left on the central portion in plan view of the opening MC functions as a protective film for etching.

This deep dry etching is performed by Bosch process with $SF_6$ as an etchant and by use of $C_4F_8$ as a gas for deposition for forming a protective film. That is, first, isotropic etching is performed with $SF_6$, and a protective film is formed of $C_4F_8$ on the surface to which the etching has been applied. Next, plasma of $SF_6$ is sputtered onto the bottom surface of the opening with an electric field, to eliminate the protective film on the bottom surface, and the bottom surface from which the protective film is eliminated is dug down by isotropic etching with $SF_6$ again. This step is repeated to dig deeply.

When the optical guide 2C is formed up to a predetermined depth, thereafter, the circular-form silicon oxide film 43 functioning as a protective film in the opening MC is eliminated with hydrofluoric acid (HF) to expose the silicon nitride film 3b as an antireflection film. Thereafter, the mask M is eliminated, and as shown in FIG. 13, the optical element 8 and the semiconductor circuit element 9 are mounted on the substrate front surface so as to be electrically connected to the portions of the electrodes of the metal wiring 5 by connections via the bumps 52 with flip-chip bonding or the like. Further, the optical fiber 7 is disposed on the rear surface by carrying out lateral positioning by the V-shaped side surfaces 2d and longitudinal positioning by the attaching surface 2b.

At this time, with respect to the optical element 8 and the semiconductor circuit element 9, after an attempt is made to protect those by incorporating those into a hermetic package, the optical fiber 7 is fixed to the guide groove 2B with an adhesive. In fixation of the optical fiber 7, when the end of the optical fiber 7 is attached to the attaching surface 2b, ultraviolet curable resin with a refractive index of 1.5 which is the same as that of the optical fiber may be applied thereto, to prevent the end face from being damaged, and the same ultraviolet curable resin may be used as an adhesive when the side surface of the optical fiber 7 is fixed to the V groove, which aims to make the operations easy.

In this way, with respect to mounting of the optical element 8 and the semiconductor circuit element 9 and mounting of the optical fiber 7, those can be incorporated into the substrate independently of one another. Additionally, the optical fiber 7 can be incorporated into the substrate after the optical element 8 and the semiconductor circuit element 9 are protected by the package, and aims to further protect the semiconductor elements and others and improve its operating efficiency.

Further, because an optical transmission path between the optical fiber 7 and the optical element 8 is capable of passing through the inside of the silicon substrate without passing through the air, it is possible to prevent light diffusion as in the air. Additionally, because the optical guide 2C including a cylindrical hole is formed in the silicon substrate 2 between the mirror surface 2a at 45 degrees and the light receiving or emitting surface of the optical element 8, it is possible to prevent light from diffusing to the outside of the optical guide 2C due to a difference in light refractive index between silicon and the air, and therefore, even when the substrate is thick, efficient optical transmission is possible.

In the present embodiment, after the depressed portion for mirror surface formation 2A and the guide groove 2B are formed on the rear surface, the antireflection film 3b on the front surface is separately formed, however, at the stage of forming the silicon oxide film 41 to which mask patterning has been applied as shown in FIG. 1, a portion on which the antireflection film 3b will be formed later may be formed as an opening in the silicon oxide film 41 on the front surface as well, and next, the corresponding portion of the silicon nitride film 31 at the time of forming the silicon nitride films 31 on the front surface and the rear surface of the substrate may be made to serve as an antireflection film.

Next, the second embodiment of the present invention will be described with reference to FIGS. 14 to 17. As described above, in the first crystal anisotropic etching, it is possible to make an appearance of a {110} plane even with a mixed liquid of KOH and IPA as an etchant and by use of a silicon oxide film as a mask, however, in that case, it is necessary to thicken in thickness the silicon oxide film. For that purpose, in the present embodiment, a mask for the first crystal anisotropic etching is made of a silicon nitride film.

Figure 14:
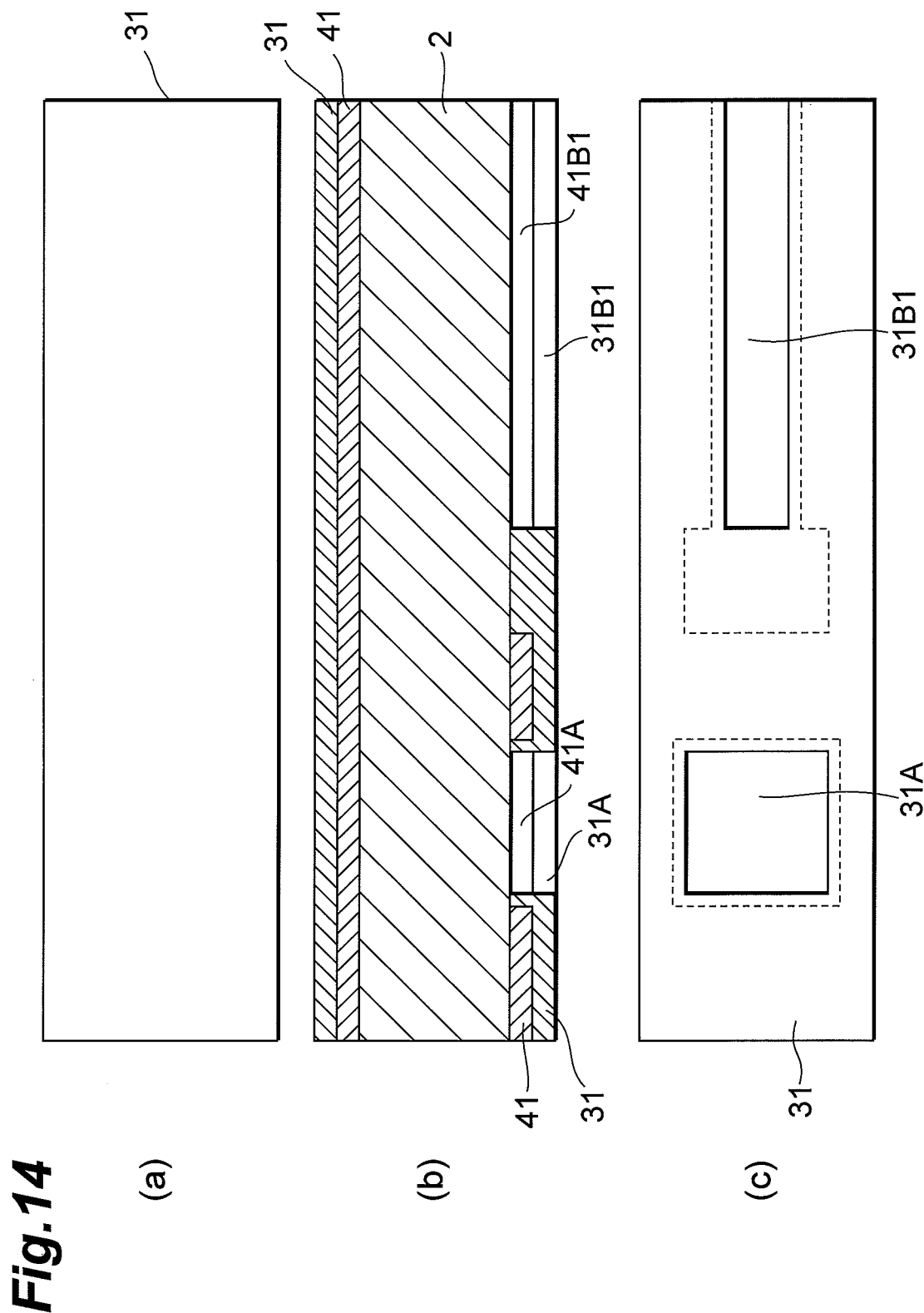
FIG. 14 is a schematic diagram showing a part of a method of manufacturing an optical element module according to a second embodiment.

As shown in FIG. 14, the opening 41A in the silicon oxide film 41 is formed to be greater, and the opening 41B1 is formed to be wider in width than those in the first embodiment. Then, the opening 31A in the silicon nitride film 31 formed on the upper surface thereof is formed to be smaller than the opening 41A, and the opening 31B1 as well is formed to be narrower in width than the opening 41B1, which does not allow the silicon oxide film 41 to be exposed on the respective openings as shown in the drawing.

Figure 15:
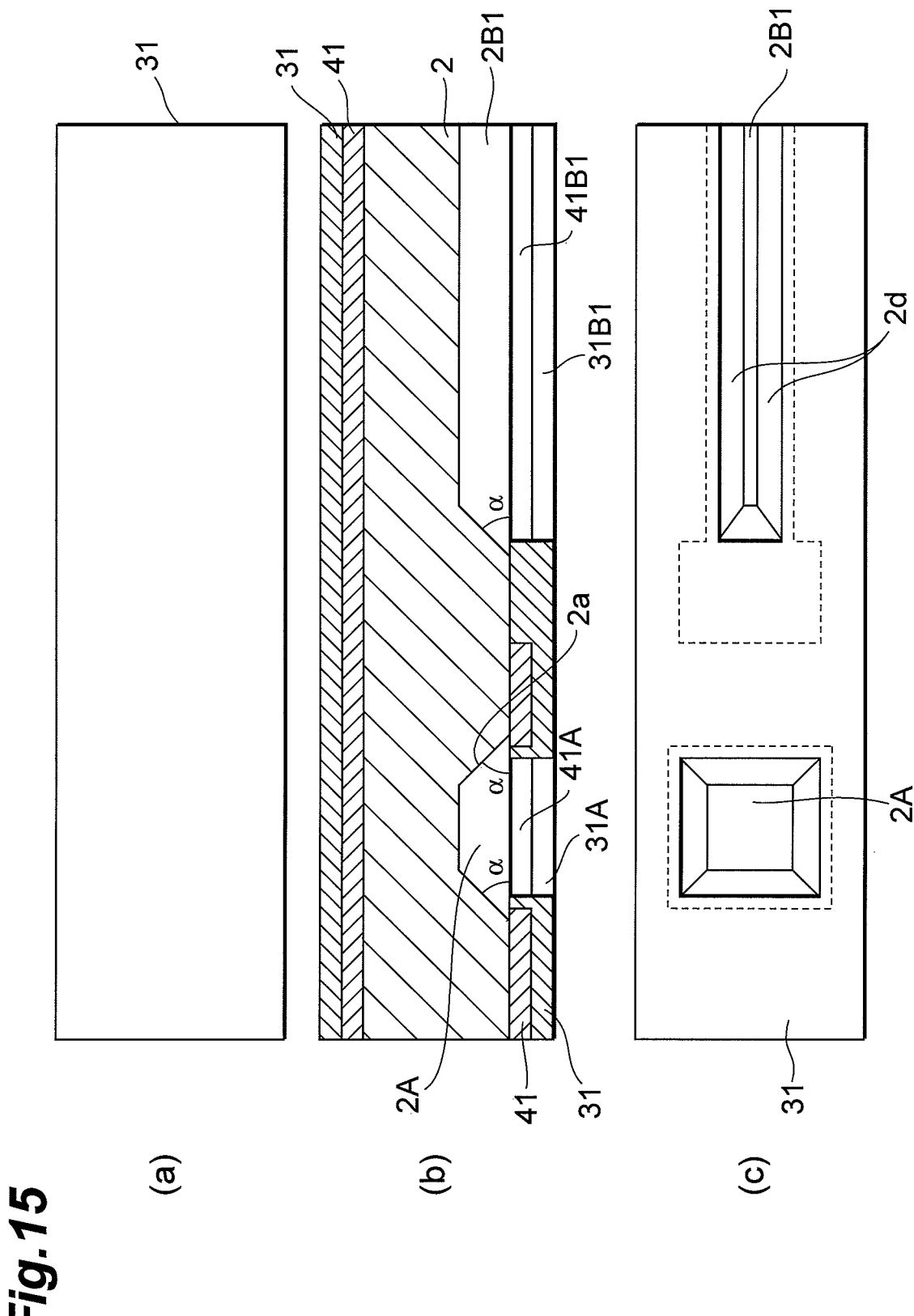
FIG. 15 is a schematic diagram showing a part of the method of manufacturing the optical element module according to the second embodiment.

Next, as shown in FIG. 15, the silicon nitride film 31 is made to function as a mask covering the peripheries of the respective openings, and the first crystal anisotropic etching with a mixed liquid of KOH and IPA as an etchant is applied. Thereby, in the same way as in the first embodiment, {110} planes with an inclination of 45 degrees shown by α are made to appear on the peripheral surfaces of the depressed portion for mirror surface formation 2A and the V groove portion 2B1, to form the mirror surface 2a and the V-shaped side surfaces 2d.

Figure 16:
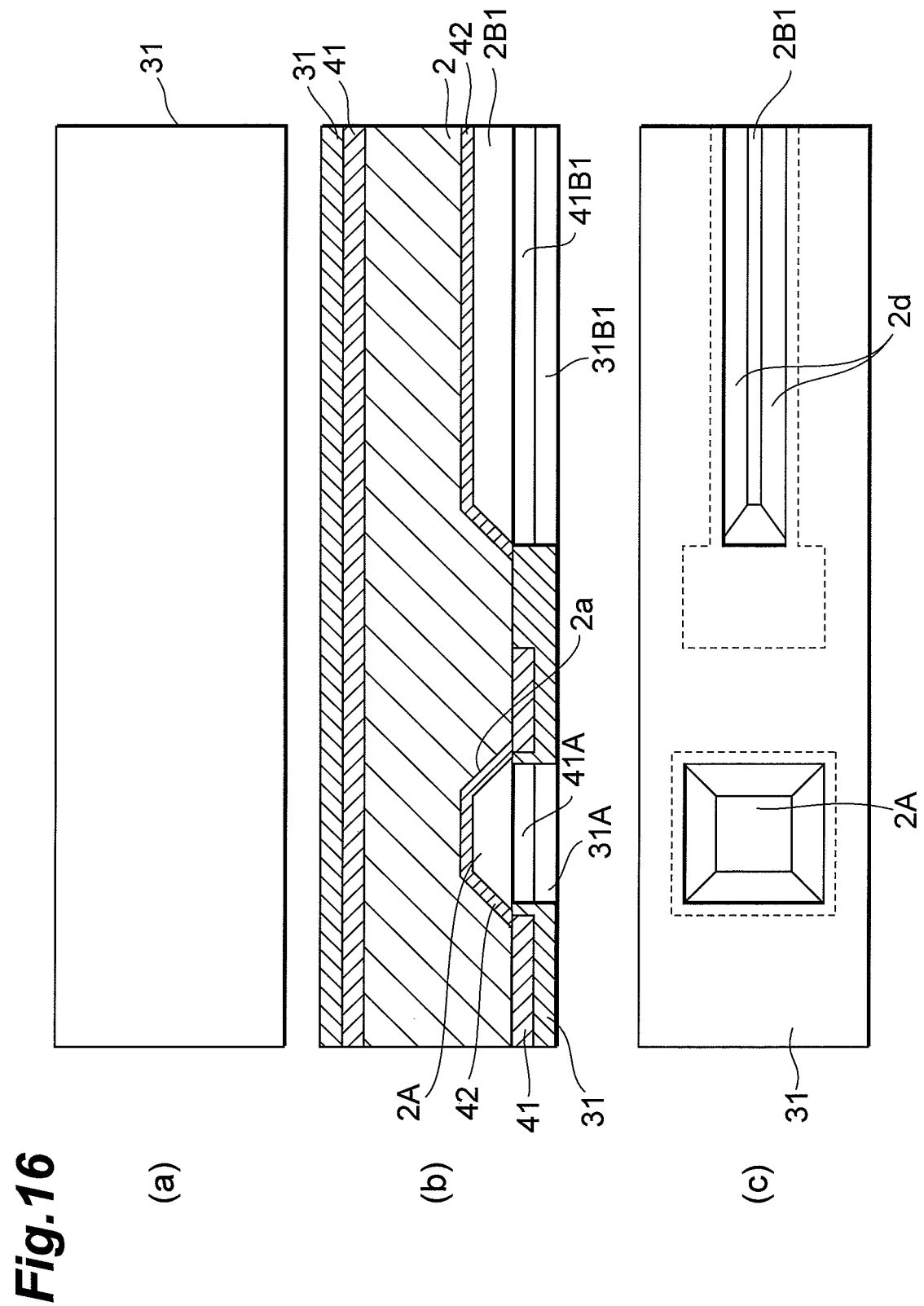
FIG. 16 is a schematic diagram showing a part of the method of manufacturing the optical element module according to the second embodiment.
Figure 17:
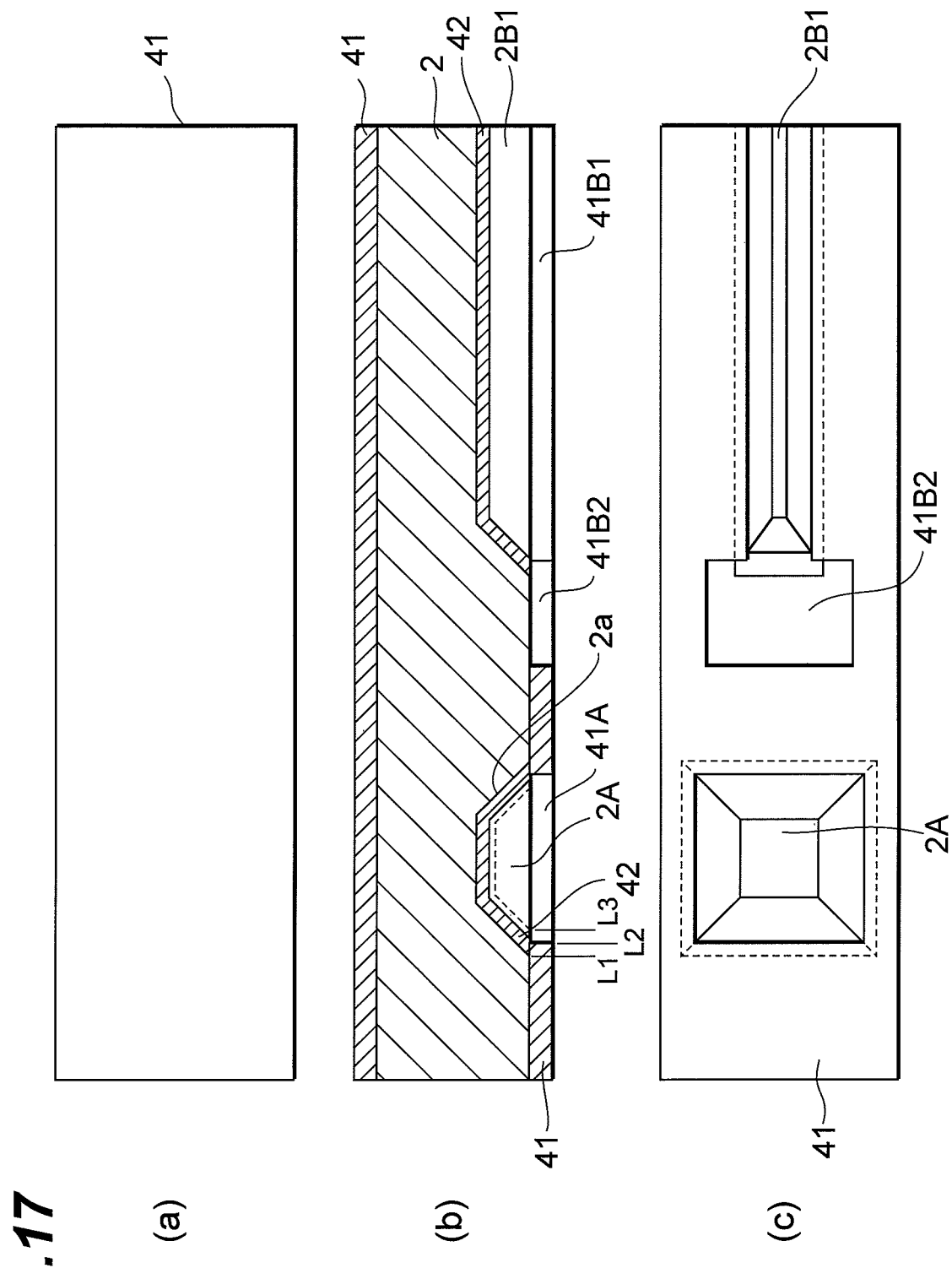
FIG. 17 is a schematic diagram showing a part of the method of manufacturing the optical element module according to the second embodiment.

Thereafter, in the same way as in the first embodiment, the silicon oxide films 42 are formed on the peripheral surfaces of the depressed portion for mirror surface formation 2A and the V groove portion 2B1 to which the etching has been applied, by thermal oxidization as shown in FIG. 16. Next, as shown in FIG. 17, by eliminating the silicon nitride film 31 with thermal phosphoric acid, in the same way as in FIG. 5 of the first embodiment, it is possible to make an appearance of the mask of the silicon oxide film 41 having the opening 41B2, which is for the second crystal anisotropic etching, on the surface. Other steps except for the above description are the same as those in the first embodiment.

Figure 18:
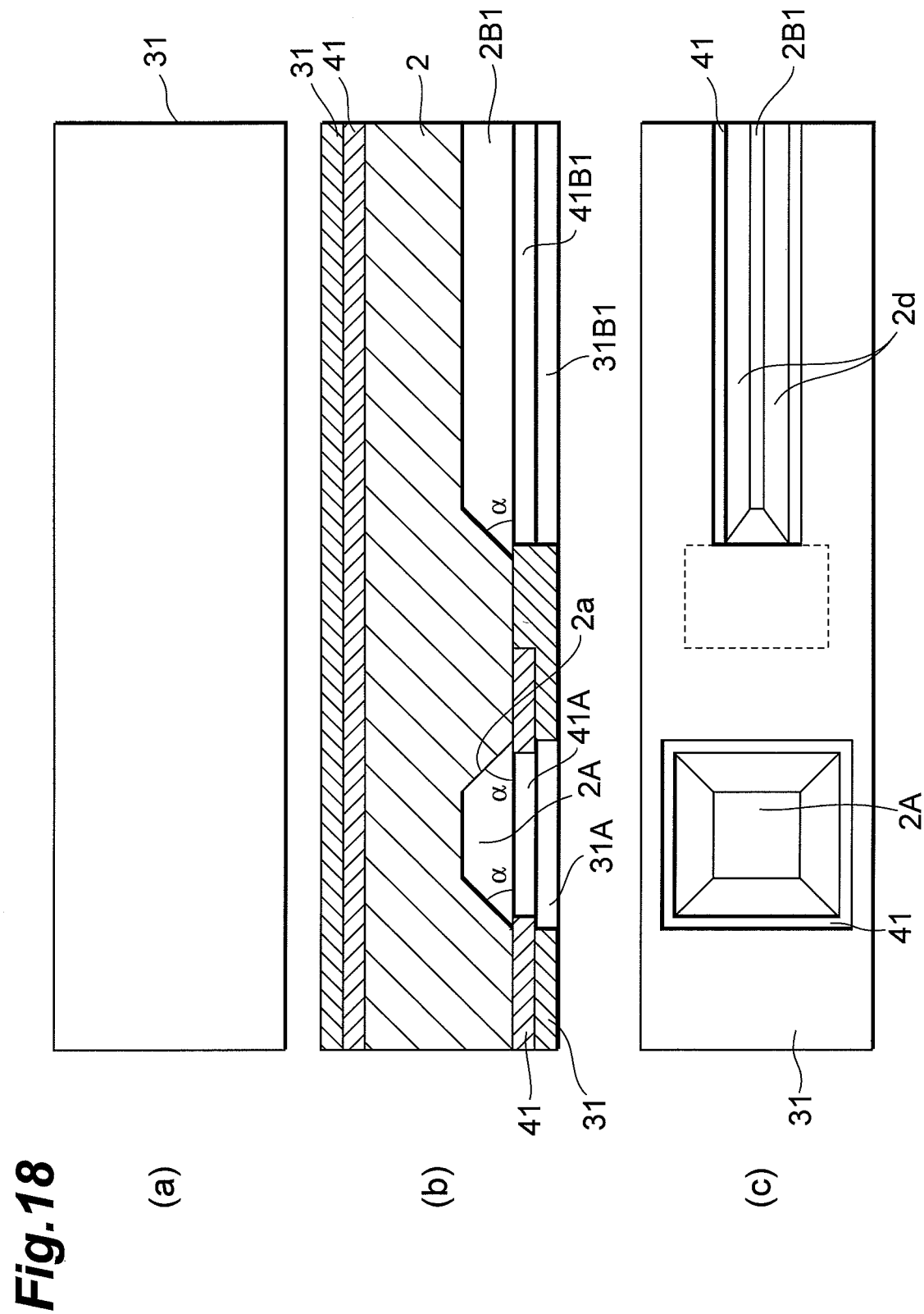
FIG. 18 is a schematic diagram showing a part of the method of manufacturing the optical element module according to the second embodiment.

Here, the first crystal anisotropic etching is required to be etching by which underetching under the mask reaches the openings 31A and 31B1 of the mask. For example, in FIG. 18, because underetching reaches L1, if the silicon oxide film 42 is formed on the etched surface, the film connects to the silicon oxide film 41 on the rear surface of the substrate 2, to form a protective film for the second crystal anisotropic etching.

However, assuming that underetching is applied up to a position L3, which does not reach a rim L2 of the opening, even if the silicon oxide film 42 is formed on the etched surface, an opening is formed between L2 and L3, which brings the second crystal anisotropic etching unnecessary for this portion to be applied. Note that etching rates for a {110} plane and a {100} plane in the first crystal anisotropic etching are approximately 1:10, and therefore, for example, when applying etching of 100 µm, it is preferable that the etching be set in expectation of underetching of approximately 10 µm.

Figure 19:
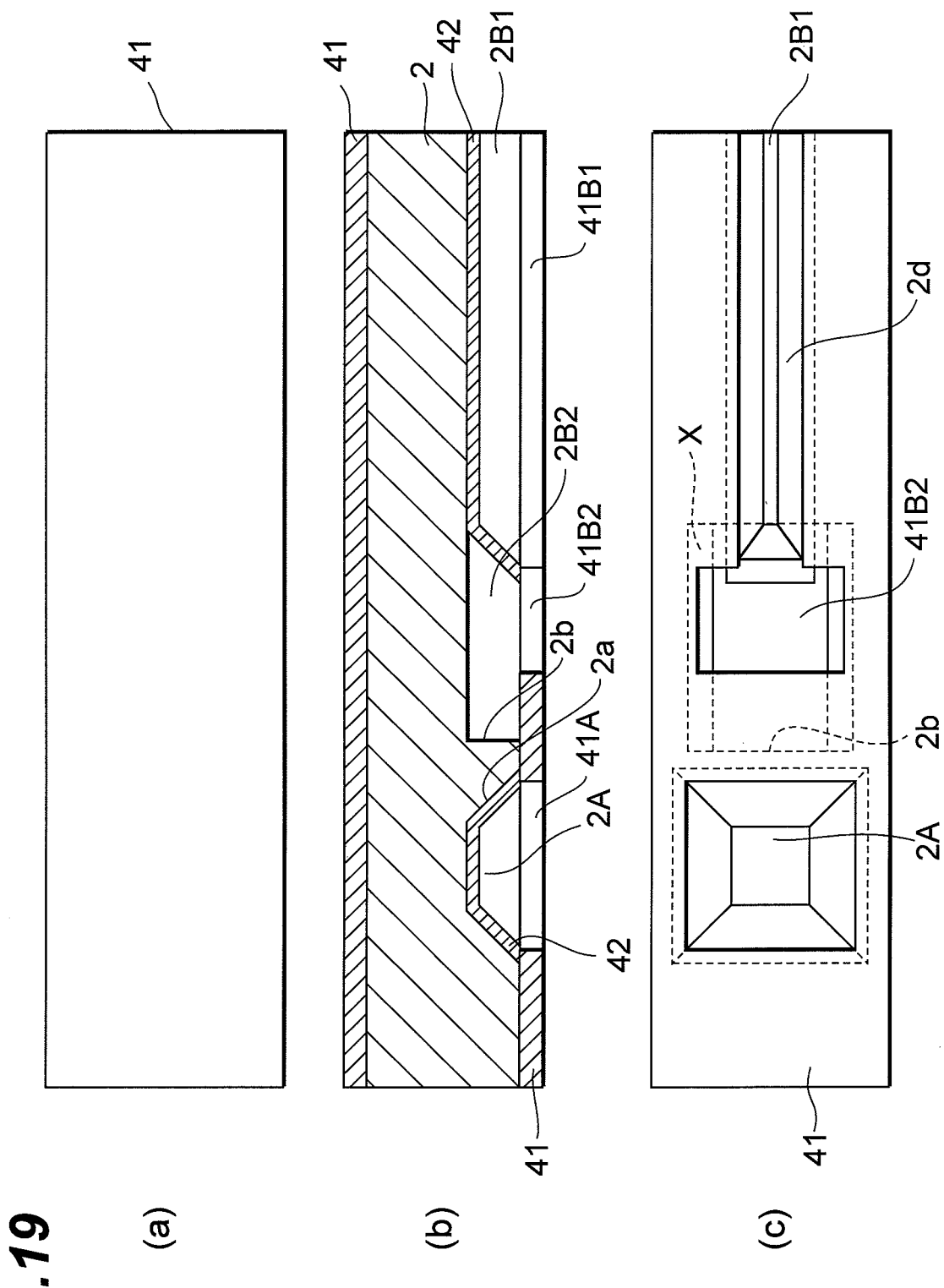
FIG. 19 is a schematic diagram showing a part of a method of manufacturing an optical element module according to a third embodiment.
Figure 20:
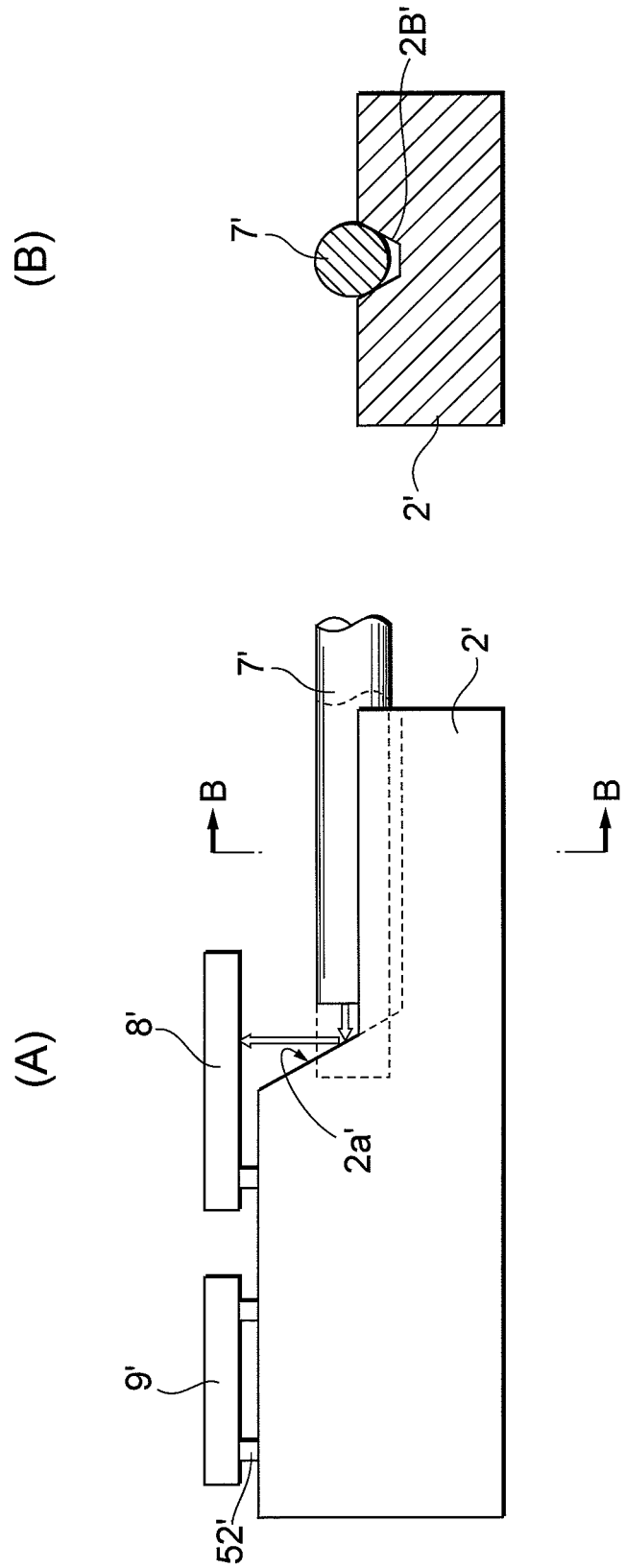
FIG. 20 is a schematic diagram showing a configuration of a conventional optical element module.

Next, a third embodiment of the present invention will be described with reference to FIG. 19. In this embodiment, a (110) silicon single crystal is used as the silicon substrate 2. Then, the vertical line (the direction in which the mirror surface 2a extends) in the view (c) of the opening 41A in the silicon oxide film 41 in FIG. 1 in the first embodiment is set to the direction crossing the (100) plane. In this case, by the first crystal anisotropic etching, a {100} plane makes its appearance on the mirror surface 2a, to form the mirror surface 2a at 45 degrees to the front surface and rear surface (110) of the substrate 2. On the other hand, {111} planes with an inclination of 35.3 degrees make their appearances on the V-shaped wall surfaces 2d of the V groove portion 2B1.

In the second crystal anisotropic etching, a {110} plane makes its appearance on the perpendicular surface, which will be the attaching surface 2b. Then, {111} planes as shown by X in the drawing make their appearances on surfaces orthogonal to the {110} plane in the portion for perpendicular surface formation 2B2. Other steps except for the above description are the same as those in the first embodiment.

However, in this embodiment, the etching to make an appearance of the perpendicular surface having the {110} plane takes a time approximately ten times as long as the time for the etching for the perpendicular surfaces in the embodiments 1 and 2. Further, because an inclined angle of the V-shaped side surfaces 2d to the front surface and the rear surface is 35.3 degrees, which is small, when an attempt is made to dispose an optical fiber with the same depth as that in the first and second embodiments, it is necessary to deepen the groove.

Further, in the respective embodiments, a condenser lens may also be prepared on the front surface of the substrate 2 of the optical guide 2C. This configuration is effective for a case in which a light passes through the inside of the optical guide 2C from the mirror surface 2a, to be emitted from the front surface toward the light receiving part of the optical element 8, and particularly, in which a light is condensed toward the light receiving part of the optical element 8 when the diameter of an optical beam entering into the optical guide 2C is great, and therefore the diameter of the optical guide 2C is set to be great.

In the case in which a condenser lens is formed, before the silicon oxide films 41 are formed on the front surface and rear surface of the silicon substrate 2, a condenser lens is first formed at a portion at which the optical guide 2C will be formed later. As a method of forming a condenser lens, for example, a method as disclosed in Japanese Patent Application Laid-Open No. H6-194502 may be used. That is, resist is disposed to be a circular form in plan view on the opening portion of the protective film in which a portion for forming lens is opened, and the resist is heated to be a thermal deformation temperature or more, which forms the resist into a convex shape with a predetermined curvature radius by utilizing thermal deformation and surface tension. Reactive ion etching (RIE) is applied to the silicon substrate from above that, which makes it possible to transfer the convex shape of the resist onto the surface of the silicon substrate, to form the lens.

Further, in the respective embodiments, for convenience of explanation, the optical element module for optically connecting the one optical element 8 and the one optical fiber 7 has been described, however, a plurality of the guide grooves 2B for optical fiber, a plurality of the optical guides 2C, and the like may be formed in parallel in the one silicon substrate 2 in order to optically connect plural and parallel optical elements and likewise plural and parallel optical fibers as arrays.

Here, in the method of manufacturing an optical element module according to the above-described embodiment, the optical element module in which an optical element and a semiconductor circuit element are mounted on one surface of a front surface and a rear surface of a silicon substrate, a mirror surface inclined at approximately 45 degrees to the one surface and the other surface is formed on the other surface, and an optical fiber facing the mirror surface is disposed in a V groove formed along the other surface, and the method of manufacturing the optical element module includes the steps of forming the mirror surface and V-shaped side surfaces of the V groove simultaneously by first crystal anisotropic etching on the other surface, and forming an attaching surface substantially perpendicular to the one surface and the other surface, which is formed at an end side of the V groove, and for attaching an end of the optical fiber, by second crystal anisotropic etching in a crystal plane orientation different from that of the first crystal anisotropic etching.

Further, it is preferable that the above-described method of manufacturing further includes a step of forming a cylindrical optical guide portion extending in a substrate thickness direction from the one surface in the silicon substrate between a light receiving part or a light emitting part of the optical element and the mirror surface, by deep dry etching. In accordance with the method of manufacturing, it is possible to form a cylindrical hole which is even long in length, in the silicon substrate between the light receiving part or the light emitting part of the optical element and the mirror surface, by deep dry etching, and thereby, it is possible to prevent a light passing through that portion from diffusing.

Further, it is preferable that, in the method of manufacturing described above, the silicon substrate is a (100) silicon single crystal, the first crystal anisotropic etching is etching to make an appearance of a {110} plane, and the second crystal anisotropic etching is etching to make an appearance of a {100} plane. In accordance with the method of manufacturing, both of the mirror surface and the V-shaped side surfaces of the V groove are simultaneously formed to be surfaces respectively inclined at approximately 45 degrees in their cross sections. Then, because the depths of those surfaces as well are formed to be substantially the same, the relative positions in the substrate thickness direction of the optical fiber disposed in the V groove and the mirror surface are constant even if an etching condition and the like are changed, which makes positioning of the optical fiber and the mirror surface easier.

Further, it is preferable that, in the method of manufacturing described above, the first crystal anisotropic etching is performed with a mask in which a silicon nitride film is laminated on a silicon oxide film, and after a protective film is formed on the etched surface, the second crystal anisotropic etching is performed with a mask in which an opening of the silicon oxide film is exposed by eliminating the silicon nitride film.

In accordance with the method of manufacturing, the mask in which the silicon oxide film and the silicon nitride film are laminated is used as a mask for the step of the first crystal anisotropic etching to form a mirror surface and V-shaped side surfaces of the V groove. Then, in the second crystal anisotropic etching to form a substantially perpendicular attaching surface in the following step, the protective film is formed on a portion which has been etched in the previous step, that is to be protected, and the silicon nitride film as an upper layer is further eliminated, which exposes an opening (an opening for the crystal anisotropic etching to form a substantially perpendicular attaching surface in the following step) in the silicon oxide film covered with the silicon nitride film until then, and the silicon oxide film having the opening is used as a mask.

When an attempt is made to form a new silicon oxide film mask on the other surface of the silicon substrate in which depressed portions for forming a mirror or a V groove are formed, by the first crystal anisotropic etching, after a silicon oxide film is formed thereon, a resist film is applied on the silicon oxide film, and patterning of openings is applied to the resist film, to transfer the openings onto the silicon oxide film, however, it is difficult to apply resist onto the surface in which depressed portions are formed. In the case of the method of manufacturing described above, it is possible to use a silicon oxide film mask without causing such a difficulty.

Further, it is preferable that the method of manufacturing described above further includes a step of forming a silicon nitride film as an antireflection film on a portion through which light passes in at least one of the perpendicular surface and the surface on which the optical element is mounted. In accordance with the method of manufacturing, it is possible to efficiently form a silicon nitride film as an antireflection film on at least one of the perpendicular surface and the surface on which the optical element is mounted.

The optical element module according to the above-described embodiment includes a silicon substrate in which an optical element and a semiconductor circuit element are mounted on one surface of a front surface and a rear surface thereof, and an optical fiber is mounted on the other surface, the optical element and the semiconductor circuit element which are mounted on the one surface and are connected to a metal wiring formed on the one surface via bumps, and the optical fiber which is mounted along the other surface on the other surface, and in which, on the other surface of the silicon substrate, a mirror surface inclined at approximately 45 degrees to the one surface and the other surface, a V groove for carrying out positioning to dispose the optical fiber facing the mirror surface along the other surface, and an attaching surface substantially perpendicular to the one surface and the other surface, which is formed at an end side of the V groove, and for attaching an end of the optical fiber, are formed, and on the one surface of the silicon substrate, an optical guide composed of a cylindrical hole extending in a substrate thickness direction from the one surface is formed between a light receiving part or a light emitting part of the optical element and the mirror surface.

The present invention can be utilized as an optical element module including an optical element that receives light or emits light, a semiconductor circuit element, and an optical fiber optically connected to the optical element, the optical element module highly-functionally performs an optical connection between the optical element and the optical fiber, and as a method of efficiently manufacturing the optical element module.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An optical element module comprising:
   a silicon substrate in which an optical element and a semiconductor circuit element are mounted on one surface of a front surface and a rear surface thereof, and an optical fiber is mounted on the other surface;
   wherein the optical element and the semiconductor circuit element are mounted on the one surface and are connected to a metal wiring formed on the one surface via bumps;
   wherein the optical fiber is mounted along the other surface on the other surface;
   wherein, on the other surface of the silicon substrate, a mirror surface inclined at approximately 45 degrees with respect to the one surface and the other surface, a V groove for carrying out positioning to dispose the optical fiber facing the mirror surface along the other surface, and an attaching surface substantially perpendicular to the one surface and the other surface, which is formed at an end side of the V groove, and for attaching an end of the optical fiber, are formed;
   wherein the silicon substrate is a (100) silicon single crystal, each of the mirror surface and V-shaped side surfaces of the V groove is a {110} plane, and the attaching surface is a {100} plane;
   wherein silicon nitride films are formed on the entire other surface of the silicon substrate and on a portion of the one surface of the silicon substrate through which light passes; and
   wherein a silicon oxide film is further formed on the silicon nitride film on the other surface of the silicon substrate.

* * * * *